(12) United States Patent
Wickboldt et al.

(10) Patent No.: US 9,152,838 B2
(45) Date of Patent: Oct. 6, 2015

(54) FINGERPRINT SENSOR PACKAGINGS AND METHODS

(71) Applicant: Synaptics Incorporated, San Jose, CA (US)

(72) Inventors: Paul Wickboldt, Walnut Creek, CA (US); Richard Brian Nelson, Chandler, AZ (US); Richard Alexander Erhart, Tempe, AZ (US)

(73) Assignee: Synaptics Incorporated, San Jose, CA (US)

( * ) Notice: Subject to any disclaimer, the term of this patent is extended or adjusted under 35 U.S.C. 154(b) by 189 days.

(21) Appl. No.: 13/850,439

(22) Filed: Mar. 26, 2013

(65) Prior Publication Data

US 2013/0259329 A1    Oct. 3, 2013

Related U.S. Application Data

(60) Provisional application No. 61/617,500, filed on Mar. 29, 2012, provisional application No. 61/754,287, filed on Jan. 18, 2013.

(51) Int. Cl.
*G06K 9/00* (2006.01)
*G06F 1/16* (2006.01)
*H05K 1/18* (2006.01)

(52) U.S. Cl.
CPC .......... *G06K 9/00013* (2013.01); *G06F 1/1626* (2013.01); *G06K 9/00053* (2013.01); *G06K 9/00919* (2013.01); *H05K 1/189* (2013.01); *H05K 2201/10151* (2013.01)

(58) Field of Classification Search
USPC ............. 382/115–127; 340/5.8–5.86; 283/68, 283/69, 78; 356/71; 713/186; 902/3
See application file for complete search history.

(56) References Cited

U.S. PATENT DOCUMENTS

| | | |
|---|---|---|
| 4,151,512 A | 4/1979 | Rigannati et al. |
| 4,225,850 A | 9/1980 | Chang et al. |
| 4,310,827 A | 1/1982 | Asi |
| 4,353,056 A | 10/1982 | Tsikos |
| 4,405,829 A | 9/1983 | Rivest et al. |
| 4,525,859 A | 6/1985 | Bowles et al. |
| 4,550,221 A | 10/1985 | Mabusth |
| 4,580,790 A | 4/1986 | Doose |
| 4,758,622 A | 7/1988 | Gosselin |
| 4,817,183 A | 3/1989 | Sparrow |
| 5,076,566 A | 12/1991 | Kriegel |

(Continued)

FOREIGN PATENT DOCUMENTS

| | | |
|---|---|---|
| DE | 2213813 A1 | 10/1973 |
| EP | 0929028 A2 | 1/1998 |

(Continued)

OTHER PUBLICATIONS

Matsumoto et al., Impact of Artificial "Gummy" Fingers on Fingerprint Systems, SPIE 4677 (2002), reprinted from cryptome.org.

(Continued)

*Primary Examiner* — Aaron W Carter
(74) *Attorney, Agent, or Firm* — Leydig, Voit & Mayer, Ltd.

(57) ABSTRACT

A fingerprint sensor which includes a conductive layer which is incorporatable within a housing adaptable for use in an electronic device.

20 Claims, 11 Drawing Sheets

(56) References Cited

U.S. PATENT DOCUMENTS

| | | | |
|---|---|---|---|
| 5,109,427 A | 4/1992 | Yang | |
| 5,140,642 A | 8/1992 | Hau et al. | |
| 5,305,017 A | 4/1994 | Gerpheide | |
| 5,319,323 A | 6/1994 | Fong | |
| 5,325,442 A | 6/1994 | Knapp | |
| 5,420,936 A | 5/1995 | Fitzpatrick et al. | |
| 5,422,807 A | 6/1995 | Mitra et al. | |
| 5,456,256 A | 10/1995 | Schneider et al. | |
| 5,543,591 A | 8/1996 | Gillespie et al. | |
| 5,569,901 A | 10/1996 | Bridgelall et al. | |
| 5,623,552 A | 4/1997 | Lane | |
| 5,627,316 A | 5/1997 | De Winter et al. | |
| 5,650,842 A | 7/1997 | Maase et al. | |
| 5,717,777 A | 2/1998 | Wong et al. | |
| 5,781,651 A | 7/1998 | Hsiao et al. | |
| 5,801,681 A | 9/1998 | Sayag | |
| 5,818,956 A | 10/1998 | Tuli | |
| 5,838,306 A | 11/1998 | O'Connor | |
| 5,848,176 A | 12/1998 | Harra et al. | |
| 5,850,450 A | 12/1998 | Schweitzer et al. | |
| 5,852,670 A | 12/1998 | Setlak et al. | |
| 5,864,296 A | 1/1999 | Upton | |
| 5,887,343 A | 3/1999 | Salatino et al. | |
| 5,892,824 A | 4/1999 | Beatson et al. | |
| 5,903,225 A | 5/1999 | Schmitt et al. | |
| 5,915,757 A | 6/1999 | Tsuyama et al. | |
| 5,920,384 A | 7/1999 | Borza | |
| 5,920,640 A | 7/1999 | Salatino et al. | |
| 5,940,526 A | 8/1999 | Setlak et al. | |
| 5,999,637 A | 12/1999 | Toyoda et al. | |
| 6,002,815 A | 12/1999 | Immega et al. | |
| 6,016,355 A | 1/2000 | Dickinson et al. | |
| 6,052,475 A | 4/2000 | Upton | |
| 6,067,368 A | 5/2000 | Setlak et al. | |
| 6,073,343 A | 6/2000 | Petrick et al. | |
| 6,076,566 A | 6/2000 | Lowe | |
| 6,088,585 A | 7/2000 | Schmitt et al. | |
| 6,098,175 A | 8/2000 | Lee | |
| 6,134,340 A | 10/2000 | Hsu et al. | |
| 6,157,722 A | 12/2000 | Lerner et al. | |
| 6,161,213 A | 12/2000 | Lofstrom | |
| 6,175,407 B1 | 1/2001 | Santor | |
| 6,182,076 B1 | 1/2001 | Yu et al. | |
| 6,182,892 B1 | 2/2001 | Angelo et al. | |
| 6,185,318 B1 | 2/2001 | Jain et al. | |
| 6,234,031 B1 | 5/2001 | Suga | |
| 6,241,288 B1 | 6/2001 | Bergenek et al. | |
| 6,259,108 B1 | 7/2001 | Antonelli et al. | |
| 6,289,114 B1 | 9/2001 | Mainguet | |
| 6,317,508 B1 | 11/2001 | Kramer et al. | |
| 6,320,394 B1 | 11/2001 | Tartagni | |
| 6,332,193 B1 | 12/2001 | Glass et al. | |
| 6,333,989 B1 | 12/2001 | Borza | |
| 6,337,919 B1 | 1/2002 | Duton | |
| 6,346,739 B1 | 2/2002 | Lepert et al. | |
| 6,347,040 B1 | 2/2002 | Fries et al. | |
| 6,360,004 B1 | 3/2002 | Akizuki | |
| 6,362,633 B1 | 3/2002 | Tartagni | |
| 6,392,636 B1 | 5/2002 | Ferrari et al. | |
| 6,399,994 B2 | 6/2002 | Shobu | |
| 6,400,836 B2 | 6/2002 | Senior | |
| 6,401,551 B1 | 6/2002 | Kawahara et al. | |
| 6,408,087 B1 | 6/2002 | Kramer | |
| 6,473,072 B1 | 10/2002 | Comiskey et al. | |
| 6,509,501 B2 | 1/2003 | Eicken et al. | |
| 6,539,101 B1 | 3/2003 | Black | |
| 6,580,816 B2 | 6/2003 | Kramer et al. | |
| 6,597,289 B2 | 7/2003 | Sabatini | |
| 6,643,389 B1 | 11/2003 | Raynal et al. | |
| 6,672,174 B2 | 1/2004 | Deconde et al. | |
| 6,738,050 B2 | 5/2004 | Comiskey et al. | |
| 6,741,729 B2 | 5/2004 | Bjorn et al. | |
| 6,757,002 B1 | 6/2004 | Oross et al. | |
| 6,766,040 B1 | 7/2004 | Catalano et al. | |
| 6,785,407 B1 | 8/2004 | Tschudi et al. | |
| 6,838,905 B1 | 1/2005 | Doyle | |
| 6,886,104 B1 | 4/2005 | McClurg et al. | |
| 6,897,002 B2 | 5/2005 | Teraoka et al. | |
| 6,898,299 B1 | 5/2005 | Brooks | |
| 6,924,496 B2 | 8/2005 | Manansala | |
| 6,937,748 B1 | 8/2005 | Schneider et al. | |
| 6,941,001 B1 | 9/2005 | Bolle et al. | |
| 6,941,810 B2 | 9/2005 | Okada | |
| 6,950,540 B2 | 9/2005 | Higuchi | |
| 6,950,541 B1 * | 9/2005 | Setlak et al. | 382/126 |
| 6,959,874 B2 | 11/2005 | Bardwell | |
| 6,963,626 B1 | 11/2005 | Shaeffer et al. | |
| 6,970,584 B2 | 11/2005 | O'Gorman et al. | |
| 6,980,672 B2 | 12/2005 | Saito et al. | |
| 6,983,882 B2 | 1/2006 | Cassone | |
| 7,013,030 B2 | 3/2006 | Wong et al. | |
| 7,020,591 B1 | 3/2006 | Wei et al. | |
| 7,030,860 B1 | 4/2006 | Hsu et al. | |
| 7,035,443 B2 | 4/2006 | Wong | |
| 7,042,535 B2 | 5/2006 | Katoh et al. | |
| 7,043,061 B2 | 5/2006 | Hamid et al. | |
| 7,043,644 B2 | 5/2006 | DeBruine | |
| 7,046,230 B2 | 5/2006 | Zadesky et al. | |
| 7,064,743 B2 | 6/2006 | Nishikawa | |
| 7,099,496 B2 | 8/2006 | Benkley | |
| 7,110,577 B1 | 9/2006 | Tschud | |
| 7,113,622 B2 | 9/2006 | Hamid | |
| 7,126,389 B1 | 10/2006 | McRae et al. | |
| 7,129,926 B2 | 10/2006 | Mathiassen et al. | |
| 7,136,514 B1 | 11/2006 | Wong | |
| 7,146,024 B2 | 12/2006 | Benkley | |
| 7,146,026 B2 | 12/2006 | Russon et al. | |
| 7,146,029 B2 | 12/2006 | Manansala | |
| 7,190,816 B2 | 3/2007 | Mitsuyu et al. | |
| 7,194,392 B2 | 3/2007 | Tuken et al. | |
| 7,197,168 B2 | 3/2007 | Russo | |
| 7,200,250 B2 | 4/2007 | Chou | |
| 7,251,351 B2 | 7/2007 | Mathiassen et al. | |
| 7,258,279 B2 | 8/2007 | Schneider et al. | |
| 7,260,246 B2 | 8/2007 | Fujii | |
| 7,263,212 B2 | 8/2007 | Kawabe | |
| 7,263,213 B2 | 8/2007 | Rowe | |
| 7,289,649 B1 | 10/2007 | Walley et al. | |
| 7,290,323 B2 | 11/2007 | Deconde et al. | |
| 7,308,121 B2 | 12/2007 | Mathiassen et al. | |
| 7,308,122 B2 | 12/2007 | McClurg et al. | |
| 7,321,672 B2 | 1/2008 | Sasaki et al. | |
| 7,356,169 B2 | 4/2008 | Hamid | |
| 7,360,688 B1 | 4/2008 | Harris | |
| 7,369,685 B2 | 5/2008 | DeLean | |
| 7,379,569 B2 | 5/2008 | Chikazawa et al. | |
| 7,409,876 B2 | 8/2008 | Ganapathi et al. | |
| 7,412,083 B2 | 8/2008 | Takahashi | |
| 7,417,310 B2 * | 8/2008 | Szewerenko et al. | 257/696 |
| 7,424,618 B2 | 9/2008 | Roy et al. | |
| 7,447,339 B2 | 11/2008 | Mimura et al. | |
| 7,447,911 B2 | 11/2008 | Chou et al. | |
| 7,460,697 B2 | 12/2008 | Erhart et al. | |
| 7,463,756 B2 | 12/2008 | Benkley | |
| 7,505,611 B2 | 3/2009 | Fyke | |
| 7,505,613 B2 | 3/2009 | Russo | |
| 7,565,548 B2 | 7/2009 | Fiske et al. | |
| 7,574,022 B2 | 8/2009 | Russo | |
| 7,643,950 B1 | 1/2010 | Getzin et al. | |
| 7,646,897 B2 | 1/2010 | Fyke | |
| 7,681,232 B2 | 3/2010 | Nordentoft et al. | |
| 7,689,013 B2 | 3/2010 | Shinzaki | |
| 7,706,581 B2 | 4/2010 | Drews et al. | |
| 7,733,697 B2 | 6/2010 | Picca et al. | |
| 7,751,601 B2 | 7/2010 | Benkley | |
| 7,843,438 B2 | 11/2010 | Onoda | |
| 7,899,216 B2 | 3/2011 | Watanabe et al. | |
| 7,953,258 B2 | 5/2011 | Dean et al. | |
| 8,005,276 B2 | 8/2011 | Dean et al. | |
| 8,031,916 B2 | 10/2011 | Abiko et al. | |
| 8,077,935 B2 | 12/2011 | Geoffroy et al. | |
| 8,701,267 B2 * | 4/2014 | Goldenberg et al. | 29/592.1 |
| 8,736,001 B2 * | 5/2014 | Salatino et al. | 257/415 |
| 2001/0026636 A1 | 10/2001 | Mainget | |

(56) References Cited

U.S. PATENT DOCUMENTS

| | | |
|---|---|---|
| 2001/0030644 A1 | 10/2001 | Allport |
| 2001/0036299 A1 | 11/2001 | Senior |
| 2001/0043728 A1 | 11/2001 | Kramer et al. |
| 2002/0025062 A1 | 2/2002 | Black |
| 2002/0061125 A1 | 5/2002 | Fujii |
| 2002/0064892 A1 | 5/2002 | Lepert et al. |
| 2002/0067845 A1 | 6/2002 | Griffis |
| 2002/0073046 A1 | 6/2002 | David |
| 2002/0089044 A1 | 7/2002 | Simmons et al. |
| 2002/0089410 A1 | 7/2002 | Janiak et al. |
| 2002/0096731 A1 | 7/2002 | Wu et al. |
| 2002/0122026 A1 | 9/2002 | Bergstrom |
| 2002/0126516 A1 | 9/2002 | Jeon |
| 2002/0133725 A1 | 9/2002 | Roy et al. |
| 2002/0181749 A1 | 12/2002 | Matsumoto et al. |
| 2003/0002717 A1 | 1/2003 | Hamid |
| 2003/0002719 A1 | 1/2003 | Hamid et al. |
| 2003/0021495 A1 | 1/2003 | Cheng |
| 2003/0035570 A1 | 2/2003 | Benkley |
| 2003/0063782 A1 | 4/2003 | Acharya et al. |
| 2003/0068072 A1 | 4/2003 | Hamid |
| 2003/0076301 A1 | 4/2003 | Tsuk et al. |
| 2003/0076303 A1 | 4/2003 | Huppi |
| 2003/0095096 A1 | 5/2003 | Robbin et al. |
| 2003/0102874 A1 | 6/2003 | Lane et al. |
| 2003/0123714 A1 | 7/2003 | O'Gorman et al. |
| 2003/0123715 A1 | 7/2003 | Uchida |
| 2003/0141959 A1 | 7/2003 | Keogh et al. |
| 2003/0147015 A1 | 8/2003 | Katoh et al. |
| 2003/0161510 A1 | 8/2003 | Fuji |
| 2003/0161512 A1 | 8/2003 | Mathiassen |
| 2003/0169228 A1 | 9/2003 | Mathiassen et al. |
| 2003/0174256 A1 | 9/2003 | Kim et al. |
| 2003/0174871 A1 | 9/2003 | Yoshioka et al. |
| 2003/0186157 A1 | 10/2003 | Teraoka et al. |
| 2003/0209293 A1 | 11/2003 | Sako et al. |
| 2003/0224553 A1 | 12/2003 | Manansala |
| 2004/0012773 A1 | 1/2004 | Puttkammer |
| 2004/0022001 A1 | 2/2004 | Chu et al. |
| 2004/0042642 A1 | 3/2004 | Bolle et al. |
| 2004/0050930 A1 | 3/2004 | Rowe |
| 2004/0066613 A1 | 4/2004 | Leitao |
| 2004/0076313 A1 | 4/2004 | Bronstein et al. |
| 2004/0081339 A1 | 4/2004 | Benkley |
| 2004/0096086 A1 | 5/2004 | Miyasaka |
| 2004/0113956 A1 | 6/2004 | Bellwood et al. |
| 2004/0120400 A1 | 6/2004 | Linzer |
| 2004/0123113 A1* | 6/2004 | Mathiassen et al. .......... 713/185 |
| 2004/0125993 A1 | 7/2004 | Zhao et al. |
| 2004/0129787 A1 | 7/2004 | Saito |
| 2004/0136612 A1 | 7/2004 | Meister et al. |
| 2004/0172339 A1 | 9/2004 | Snelgrove et al. |
| 2004/0179718 A1 | 9/2004 | Chou |
| 2004/0184641 A1 | 9/2004 | Nagasaka et al. |
| 2004/0190761 A1 | 9/2004 | Lee |
| 2004/0208346 A1 | 10/2004 | Baharav et al. |
| 2004/0208347 A1 | 10/2004 | Baharav et al. |
| 2004/0208348 A1 | 10/2004 | Baharav et al. |
| 2004/0213441 A1 | 10/2004 | Tschudi |
| 2004/0215689 A1 | 10/2004 | Dooley et al. |
| 2004/0228505 A1 | 11/2004 | Sugimoto |
| 2004/0228508 A1 | 11/2004 | Shigeta |
| 2004/0240712 A1 | 12/2004 | Rowe et al. |
| 2004/0252867 A1 | 12/2004 | Lan et al. |
| 2005/0031174 A1 | 2/2005 | Ryhanen et al. |
| 2005/0036665 A1 | 2/2005 | Higuchi |
| 2005/0047485 A1 | 3/2005 | Khayrallah et al. |
| 2005/0100196 A1 | 5/2005 | Scott et al. |
| 2005/0109835 A1 | 5/2005 | Jacoby et al. |
| 2005/0110103 A1 | 5/2005 | Setlak |
| 2005/0111708 A1 | 5/2005 | Chou |
| 2005/0123176 A1 | 6/2005 | Ishil et al. |
| 2005/0136200 A1 | 6/2005 | Durell et al. |
| 2005/0139656 A1 | 6/2005 | Arnouse |
| 2005/0162402 A1 | 7/2005 | Watanachote |
| 2005/0169503 A1 | 8/2005 | Howell et al. |
| 2005/0210271 A1 | 9/2005 | Chou et al. |
| 2005/0219200 A1 | 10/2005 | Weng |
| 2005/0220329 A1 | 10/2005 | Payne et al. |
| 2005/0231213 A1 | 10/2005 | Chou et al. |
| 2005/0238212 A1 | 10/2005 | Du et al. |
| 2005/0244038 A1 | 11/2005 | Benkley |
| 2005/0244039 A1 | 11/2005 | Geoffroy et al. |
| 2005/0249386 A1 | 11/2005 | Juh |
| 2005/0258952 A1 | 11/2005 | Utter et al. |
| 2005/0269402 A1 | 12/2005 | Spitzer et al. |
| 2006/0006224 A1 | 1/2006 | Modi |
| 2006/0055500 A1 | 3/2006 | Burke et al. |
| 2006/0066572 A1 | 3/2006 | Yumoto et al. |
| 2006/0078176 A1 | 4/2006 | Abiko et al. |
| 2006/0083411 A1 | 4/2006 | Benkley |
| 2006/0110537 A1 | 5/2006 | Huang et al. |
| 2006/0140461 A1 | 6/2006 | Kim et al. |
| 2006/0144953 A1 | 7/2006 | Takao |
| 2006/0170528 A1 | 8/2006 | Fukushige et al. |
| 2006/0187200 A1 | 8/2006 | Martin |
| 2006/0210082 A1 | 9/2006 | Devadas et al. |
| 2006/0214512 A1 | 9/2006 | Iwata |
| 2006/0239514 A1 | 10/2006 | Watanabe et al. |
| 2006/0249008 A1 | 11/2006 | Luther |
| 2006/0259873 A1 | 11/2006 | Mister |
| 2006/0261174 A1 | 11/2006 | Zellner et al. |
| 2006/0271793 A1 | 11/2006 | Devadas et al. |
| 2006/0287963 A1 | 12/2006 | Steeves et al. |
| 2007/0031011 A1 | 2/2007 | Erhart et al. |
| 2007/0036400 A1 | 2/2007 | Watanabe et al. |
| 2007/0057763 A1 | 3/2007 | Blattner et al. |
| 2007/0067828 A1 | 3/2007 | Bychkov |
| 2007/0076926 A1 | 4/2007 | Schneider et al. |
| 2007/0076951 A1 | 4/2007 | Tanaka et al. |
| 2007/0086630 A1* | 4/2007 | Setlak et al. .................. 382/124 |
| 2007/0086634 A1 | 4/2007 | Setlak et al. |
| 2007/0090312 A1 | 4/2007 | Stallinga et al. |
| 2007/0138299 A1 | 6/2007 | Mitra |
| 2007/0180261 A1 | 8/2007 | Akkermans et al. |
| 2007/0198141 A1 | 8/2007 | Moore |
| 2007/0198435 A1 | 8/2007 | Siegal et al. |
| 2007/0228154 A1 | 10/2007 | Tran |
| 2007/0237366 A1 | 10/2007 | Maletsky |
| 2007/0248249 A1 | 10/2007 | Stoianov |
| 2008/0002867 A1 | 1/2008 | Mathiassen et al. |
| 2008/0013805 A1 | 1/2008 | Sengupta et al. |
| 2008/0019578 A1 | 1/2008 | Saito et al. |
| 2008/0049980 A1* | 2/2008 | Castaneda et al. ............ 382/115 |
| 2008/0049987 A1 | 2/2008 | Champagne et al. |
| 2008/0049989 A1 | 2/2008 | Iseri et al. |
| 2008/0063245 A1 | 3/2008 | Benkley et al. |
| 2008/0069412 A1 | 3/2008 | Champagne et al. |
| 2008/0126260 A1 | 5/2008 | Cox et al. |
| 2008/0169345 A1 | 7/2008 | Keane et al. |
| 2008/0170695 A1 | 7/2008 | Adler et al. |
| 2008/0175450 A1 | 7/2008 | Scott et al. |
| 2008/0178008 A1 | 7/2008 | Takahashi et al. |
| 2008/0179112 A1 | 7/2008 | Qin et al. |
| 2008/0185429 A1 | 8/2008 | Saville |
| 2008/0201265 A1 | 8/2008 | Hewton |
| 2008/0205714 A1 | 8/2008 | Benkley et al. |
| 2008/0219521 A1 | 9/2008 | Benkley et al. |
| 2008/0222049 A1 | 9/2008 | Loomis et al. |
| 2008/0223925 A1 | 9/2008 | Saito et al. |
| 2008/0226132 A1 | 9/2008 | Gardner |
| 2008/0240523 A1 | 10/2008 | Benkley et al. |
| 2008/0244277 A1 | 10/2008 | Orsini et al. |
| 2008/0267462 A1 | 10/2008 | Nelson et al. |
| 2008/0279373 A1 | 11/2008 | Erhart et al. |
| 2009/0130369 A1 | 5/2009 | Huang et al. |
| 2009/0153297 A1 | 6/2009 | Gardner |
| 2009/0154779 A1 | 6/2009 | Satyan et al. |
| 2009/0155456 A1 | 6/2009 | Benkley et al. |
| 2009/0169071 A1 | 7/2009 | Bond et al. |
| 2009/0174974 A1 | 7/2009 | Huang et al. |
| 2009/0237135 A1 | 9/2009 | Ramaraju et al. |
| 2009/0252384 A1 | 10/2009 | Dean et al. |
| 2009/0252385 A1 | 10/2009 | Dean et al. |

(56) References Cited

U.S. PATENT DOCUMENTS

| | | |
|---|---|---|
| 2009/0252386 A1 | 10/2009 | Dean et al. |
| 2009/0257626 A1* | 10/2009 | Sherlock et al. ............. 382/126 |
| 2009/0279742 A1 | 11/2009 | Abiko |
| 2009/0319435 A1 | 12/2009 | Little et al. |
| 2009/0324028 A1 | 12/2009 | Russo |
| 2010/0026451 A1 | 2/2010 | Erhart et al. |
| 2010/0045705 A1 | 2/2010 | Vertegaal et al. |
| 2010/0083000 A1 | 4/2010 | Kesanupalli et al. |
| 2010/0097080 A1 | 4/2010 | Kobayashi et al. |
| 2010/0119124 A1 | 5/2010 | Satyan |
| 2010/0123675 A1 | 5/2010 | Ippel |
| 2010/0127366 A1 | 5/2010 | Bond et al. |
| 2010/0176823 A1 | 7/2010 | Thompson et al. |
| 2010/0176892 A1 | 7/2010 | Thompson et al. |
| 2010/0177940 A1 | 7/2010 | Dean et al. |
| 2010/0180136 A1 | 7/2010 | Thompson et al. |
| 2010/0189314 A1 | 7/2010 | Benkley et al. |
| 2010/0208953 A1 | 8/2010 | Gardner et al. |
| 2010/0220900 A1* | 9/2010 | Orsley ......................... 382/124 |
| 2010/0244166 A1 | 9/2010 | Shibuta et al. |
| 2010/0259503 A1* | 10/2010 | Yanase et al. ................ 345/174 |
| 2010/0272329 A1 | 10/2010 | Benkley |
| 2010/0284565 A1 | 11/2010 | Benkley et al. |
| 2010/0321158 A1* | 12/2010 | Setlak et al. ................. 340/5.83 |
| 2010/0321159 A1* | 12/2010 | Stewart ........................ 340/5.83 |
| 2011/0002461 A1 | 1/2011 | Erhart et al. |
| 2011/0018556 A1 | 1/2011 | Le et al. |
| 2011/0102567 A1 | 5/2011 | Erhart |
| 2011/0102569 A1 | 5/2011 | Erhart |
| 2011/0182486 A1 | 7/2011 | Valfridsson et al. |
| 2011/0214924 A1 | 9/2011 | Perezselsky et al. |
| 2011/0267298 A1 | 11/2011 | Erhart et al. |
| 2011/0298711 A1 | 12/2011 | Dean et al. |
| 2011/0304001 A1 | 12/2011 | Erhart et al. |
| 2011/0309482 A1* | 12/2011 | Salatino et al. ............... 257/659 |
| 2012/0242635 A1 | 9/2012 | Erhart et al. |
| 2013/0181949 A1* | 7/2013 | Setlak .......................... 345/175 |
| 2013/0259329 A1* | 10/2013 | Wickboldt et al. ........... 382/124 |
| 2014/0103943 A1* | 4/2014 | Dunlap et al. ................ 324/663 |

FOREIGN PATENT DOCUMENTS

| | | |
|---|---|---|
| EP | 0905646 A1 | 3/1999 |
| EP | 0973123 A1 | 1/2000 |
| EP | 1018697 A2 | 7/2000 |
| EP | 1139301 A2 | 10/2001 |
| EP | 1531419 A2 | 5/2005 |
| EP | 1533759 A1 | 5/2005 |
| EP | 1538548 A2 | 6/2005 |
| EP | 1624399 B1 | 2/2006 |
| EP | 1939788 A1 | 7/2008 |
| GB | 2331613 A | 5/1999 |
| GB | 2480919 | 12/2011 |
| GB | 2490593 | 11/2012 |
| JP | 04158434 A2 | 6/1992 |
| JP | 2005/242856 | 9/2005 |
| JP | 2010/103240 A | 6/2010 |
| WO | WO 90/03620 A1 | 4/1990 |
| WO | WO 98/58342 A1 | 12/1998 |
| WO | WO 99/28701 A1 | 6/1999 |
| WO | WO 99/43258 A1 | 9/1999 |
| WO | WO 01/22349 A1 | 3/2001 |
| WO | WO 01/94902 A2 | 12/2001 |
| WO | WO 01/94902 A3 | 12/2001 |
| WO | WO 01/95304 A1 | 12/2001 |
| WO | WO 02/11066 A1 | 2/2002 |
| WO | WO 02/47018 A2 | 6/2002 |
| WO | WO 02/47018 A3 | 6/2002 |
| WO | WO 02/061668 A1 | 8/2002 |
| WO | WO 02/077907 A1 | 10/2002 |
| WO | WO 02/093239 A1 | 11/2002 |
| WO | WO 02/099520 A1 | 12/2002 |
| WO | WO 03/063054 A2 | 7/2003 |
| WO | WO 03/075210 A2 | 9/2003 |
| WO | WO 2004/066194 A1 | 8/2004 |
| WO | WO 2004/066693 A1 | 8/2004 |
| WO | WO 2005/104012 A1 | 11/2005 |
| WO | WO 2005/106774 A2 | 11/2005 |
| WO | WO 2005/106774 A3 | 11/2005 |
| WO | WO 2006/040724 | 4/2006 |
| WO | WO 2006/041780 A1 | 4/2006 |
| WO | WO 2007/011607 A1 | 1/2007 |
| WO | WO 2008/033264 A2 | 3/2008 |
| WO | WO 2008/033264 A3 | 3/2008 |
| WO | WO 2008/033265 A2 | 6/2008 |
| WO | WO 2008/033265 A3 | 6/2008 |
| WO | WO 2008/137287 A1 | 11/2008 |
| WO | WO 2009/002599 A2 | 12/2008 |
| WO | WO 2009/002599 A3 | 12/2008 |
| WO | WO 2009/029257 A1 | 6/2009 |
| WO | WO 2009/079219 A1 | 6/2009 |
| WO | WO 2009/079221 A2 | 6/2009 |
| WO | WO 2009/079257 A1 | 6/2009 |
| WO | WO 2009/079262 A1 | 6/2009 |
| WO | WO 2010/034036 A1 | 3/2010 |
| WO | WO 2010/036445 A1 | 4/2010 |
| WO | WO 2010/143597 A1 | 12/2010 |
| WO | WO 2011/053797 A1 | 5/2011 |

OTHER PUBLICATIONS

Maltoni, "Handbook of Fingerprint Recognition", XP002355942 Springer, New York, USA, Jun. 2003 pp. 65-69.

Vermasan, et al., "A500 dpi AC Capacitive Hybrid Flip-Chip CMOS ASIC/Sensor Module for Fingerprint, Navigation, and Pointer Detection With On-Chip Data Processing", IEEE Journal of Solid State Circuits, vol. 38, No. 12, Dec. 2003, pp. 2288-2294.

Ratha, et al. "Adaptive Flow Orientation Based Feature Extraction in Fingerprint Images," Pattern Recognition, vol. 28 No. 11, 1657-1672, Nov. 1995.

Ratha, et al., "A Real Time Matching System for Large Fingerprint Databases," IEEE, Aug. 1996.

Suh, et al., "Design and Implementation of the AEGIS Single-Chip Secure Processor Using Physical Random Functions", Computer Architecture, 2005, ISCA '05, Proceedings, 32nd International Symposium, Jun. 2005 (MIT Technical Report CSAIL CSG-TR-843, 2004.

Rivest, et al., "A Method for Obtaining Digital Signatures and Public-Key Cryptosystems", Communication of the ACM, vol. 21 (2), pp. 120-126. (1978).

Hiltgen, et al., "Secure Internet Banking Authentication", IEEE Security and Privacy, IEEE Computer Society, New York, NY, US, Mar. 1, 2006, pp. 24-31, XP007908655, ISSN: 1540-7993.

Hegt, "Analysis of Current and Future Phishing Attacks on Internet Banking Services", Mater Thesis. Techische Universiteit Eindhoven—Department of Mathematics and Computer Science May 31, 2008, pp. 1-149, XP002630374, Retrieved from the Internet: URL:http://alexandria.tue.nl/extral/afstversl/wsk-i/hgt2008.pdf [retrieved on Mar. 29, 2011] *pp. 127-134, paragraph 6.2*.

Gassend, et al., "Controlled Physical Random Functions", In Proceedings of the 18th Annual Computer Security Conference, Las Vegas, Nevada, Dec. 12, 2002.

Bellagiodesigns.com (Internet Archive Wayback Machine, www.bellagiodesigns.com date: Oct. 29, 2005).

U.S. Appl. No. 61/619,254, filed on Apr. 2, 2012.

* cited by examiner

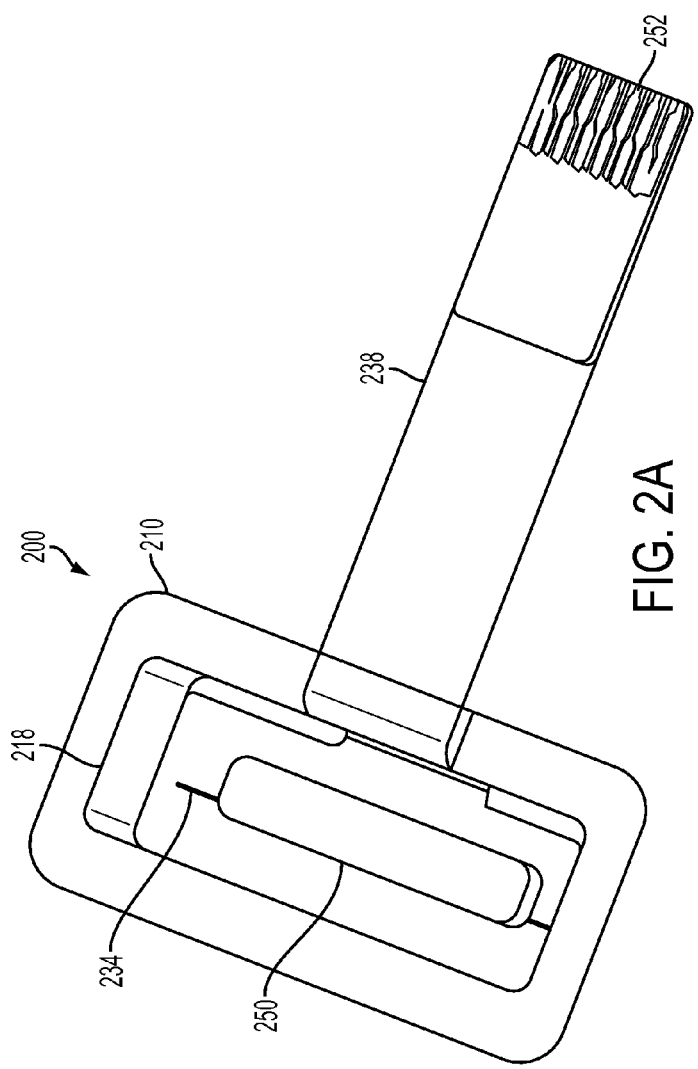
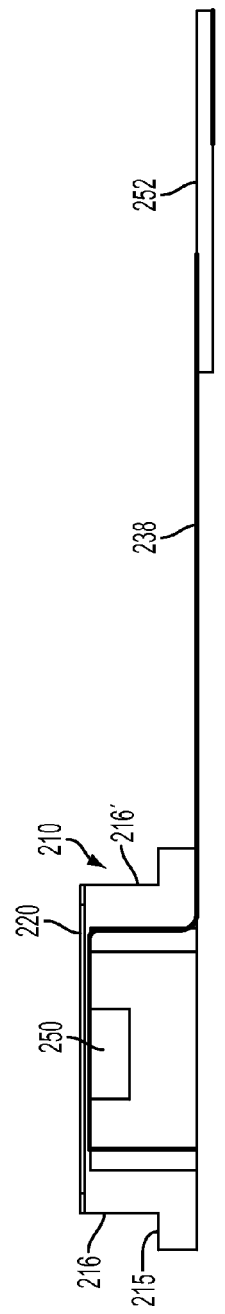

FINGERPRINT SENSOR PACKAGINGS AND METHODS

CROSS-REFERENCE

This application claims the benefit of U.S. Provisional Application Nos. 61/617,500, filed Mar. 29, 2012, entitled Fingerprint Sensor Packagings for Integration into Multi-Faceted Surfaces by Nelson and Erhart, and 61/754,287, filed Jan. 18, 2013, entitled *Compact Button Configurations and Methods* by Wickboldt, which applications are incorporated herein by reference.

BACKGROUND OF THE INVENTION

Since its inception, fingerprint sensing technology has revolutionized biometric identification and authentication processes. In most cases, a single fingerprint can be used to uniquely identify an individual in a manner that cannot be easily replicated or imitated. The ability to capture and store fingerprint image data in a digital file of minimal size has yielded immense benefits in fields such as law enforcement, forensics, and information security.

However, the widespread adoption of fingerprint sensing technology in a broad range of applications has faced a number of obstacles. Among these obstacles is the need for a separate and distinct apparatus for capturing a fingerprint image. Additionally, such components are often impractical for use in systems that are designed to be of minimal size or weight. As handheld devices begin to take on a greater range of functionality and more widespread use, engineers and designers of such devices are constantly seeking ways to maximize sophistication and ease of use while minimizing size and cost. Typically, such devices only incorporate input/output components that are deemed to be essential to core functionality, e.g., a screen, and a limited set of buttons.

For these reasons, fingerprint-based authentication techniques have not replaced username and password authentication in the most common information security applications such as email, online banking, and social networking. Paradoxically, the growing amount of sensitive information Internet users are entrusting to remote computer systems has intensified the need for authentication procedures more reliable than password-based techniques.

A form factor that is integratable into an electronic device would enhance the ability to incorporate finger print sensing technology. As will be seen, the present disclosure provides such a system that overcomes these obstacles.

SUMMARY OF THE INVENTION

An aspect of the disclosure is directed to a housing comprising: a sensor positionable within 250 microns of an uppermost surface of the housing; and a controller coupled to the sensor to capture a fingerprint image. In at least some configurations, a mask layer is provided. The mask layer can be positioned such that it has an upper surface adjacent the protective layer. Additionally, the conductive layer can be positioned such that it is disposed on a bottom surface of a mask layer and positioned on a lower surface of the protective layer. The mask layer can further include an indication, such as an aperture in the mask, of a fingerprint sensing area. In some aspects one or more controllers can be provided and further can be, but is not limited to, a chip-on-flex configuration. Additionally, the sensor can be configured such that it comprises at least one conductive layer. Conductive layers can be formed from materials selected from one or more of indium tin oxide, carbon nanotubes, metal nanowires, conductive transparent polymers and fine line metal. Additionally, the conductive layer can be formed from a flexible material. In at least some configurations, or more of each of a planarization layer, an optical coating, an optically clear adhesive, a clear plastic film, and a hard coat can be provided. Suitable material for the protective layer is selected from the group comprising ultrathin glass and polyethylene terephthalate. Furthermore, in at least some configurations, a hard coating is applied to the protective layer. Additionally, the fingerprint sensor can further be configurable to comprise a conductive layer and the touch sensor can be configurable to further comprise a conductive layer and further wherein the conductive layer of the fingerprint sensor and the conductive layer of the touch sensor are integrally formed.

An additional aspect of the disclosure is directed to a method of assembling the housing.

Yet another aspect of the disclosure is directed to a method of authenticating biometric information. A method according to the disclosure comprises: identifying a housed sensor positionable within 250 microns of an uppermost surface of an electronic device, and a controller coupled to the sensor to capture a fingerprint image wherein the controller is positionable at least one of within the housing or within the electronic device, sensing biometric information associated with a user; comparing the sensed biometric information with a biometric template associated with the user; if the biometric information matches the biometric template, receiving credentials associated with the user based on the biometric information, and communicating credentials to a requesting process.

Additionally, aspects of the disclosure include: identifying a housed sensor positionable within 250 microns of an uppermost surface of an electronic device, and a controller coupled to the sensor to capture a fingerprint image wherein the controller is positionable at least one of within the housing or within the electronic device; identifying a biometric device installed in a client device with a web-enabled application; identifying biometric information associated with a user; creating a biometric template associate with the biometric information; receiving user credentials associated with the user; and binding the user credentials with the biometric template.

A user interface suitable for incorporation into an electronic device, such as a laptop, tablet, or smart phone is disclosed, as well as methods of use and methods of manufacture. The interface has a housing with a small profile with a thickness less than or equal to 3 mm, an upper layer which fits within a housing and sits atop one or more sets of sensor traces in communication with a chip external to the interface via a flexible circuit.

An aspect of the disclosure is directed to an electronic device user interface. Suitable electronic device user interfaces comprise: a housing having side walls defining an open upper end sized to fit a biometric sensor therein; a biometric sensor capable of sensing a target biometric parameter having a sensor interface with a sensing side wherein the sensor interface is capable of positioning within the open upper end of the housing; a protective coating on the sensing side of the sensor interface; and an integrated circuit, external to the housing, in communication with the biometric sensor. In some aspects, the protective coating extends over one or more side walls of the housing. Additionally, the biometric sensor further comprises a flexible circuit substrate and at least one conductive trace connecting the biometric sensor to the integrated circuit. The conductive traces of the flexible circuit substrate can also be positionable on at least one of a side of the flexible circuit substrate facing towards an exterior of the housing and a side of the flexible circuit substrate facing towards an interior of the housing. In some configurations, the device further comprises one or more of each of: a potting material positionable between the lower surface of the housing and the protective coating; a bezel extending from the side walls of the housing above the bottom of the protective covering; and a removable bottom plate that attaches to the housing to support the biometric sensor. In some configurations, the flexible circuit wraps around the removable bottom plate. Additionally, an adhesive potting material can be provided between the bottom plate and the protective coating. In still other aspects, the biometric sensor is capable of capturing a fingerprint from a finger of a user.

Additional aspects of the disclosure are directed to a method of fabricating an electronic device user interface. The method comprises: providing a biometric sensor having a sensor interface with a sensing side and one or more conductive traces thereon in communication with a flexible circuit; placing a protective coating on the sensing side of the biometric sensor; inserting the biometric sensor into a housing; and providing an integrated circuit external to the housing in communication with the biometric sensor. An additional step can include: forming the protective coating over one or more side walls of the housing. The biometric sensor can be comprised of a flexible circuit having a flexible substrate, wherein the method further comprises the step of: forming at least one conductive trace connecting the biometric sensor to the integrated circuit. Yet another step can include forming the one or more conductive traces of the flexible circuit at least one of a side of the flexible substrate adjacent a finger of a user and a side of the flexible substrate facing away from the finger. Still other steps can include one or more of each of: providing an adhesive between the bottom portion of the housing and the protective coating; forming a bezel over at least the edges of the protective covering; providing a bottom plate that attaches to the housing to enclose the biometric sensor; forming the flexible circuit around the bottom plate; and providing an adhesive between the bottom plate and the protective coating.

Still another aspect of the disclosure is directed to a method of using an electronic device user interface. The method can comprise: providing a housing having side walls defining an open upper end sized to fit a biometric sensor therein, a biometric sensor capable of sensing a target biometric parameter having a sensor interface with a sensing side wherein the sensor interface is capable of positioning within the open upper end of the housing, a protective coating on the sensing side of the sensor interface, and an integrated circuit, external to the housing, in communication with the biometric sensor; and capturing a fingerprint from a finger of a user when the finger is applied to the biometric sensor.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 2a is a perspective bottom view of the sensor and housing of FIG. 1; FIG. 2b is a cross-sectional view of the housing and sensor of FIG. 1;

DETAILED DESCRIPTION OF THE INVENTION

I. Electronic Devices and Biometric Sensors

Figure 1:
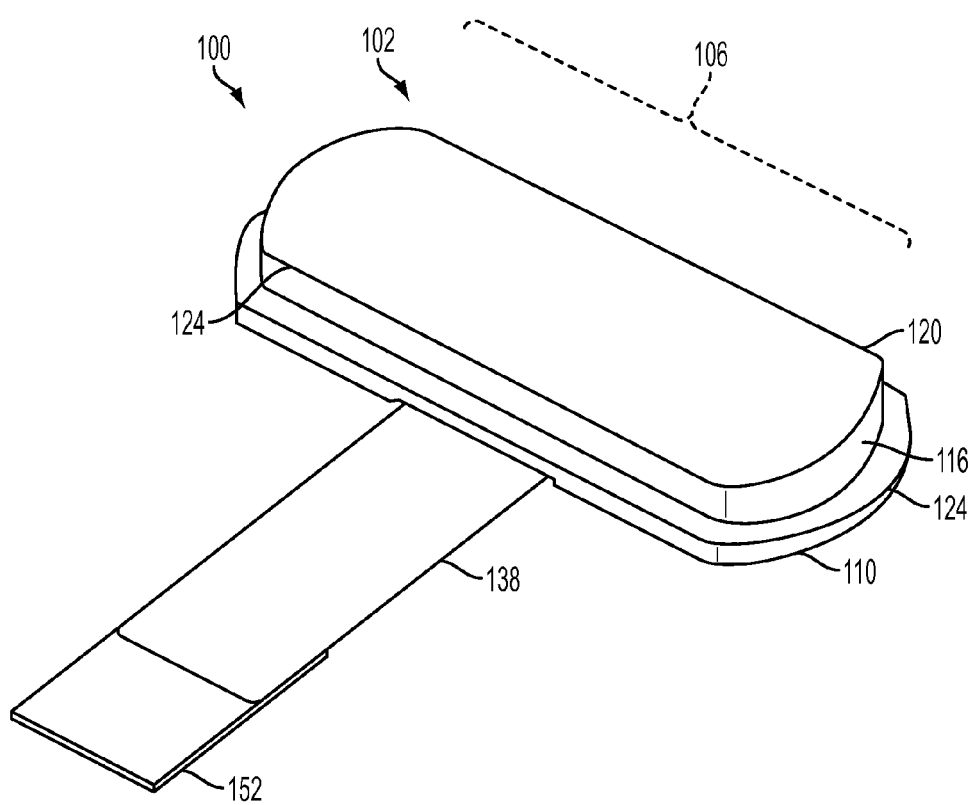
FIG. 1 is a perspective top view of a sensor and housing adaptable to be incorporated into an electronic devices.

As will be appreciated by those skilled in the art, electronic devices can be configured to include a variety of components and features including: a display, a touch screen, a scratch-resistant cover (e.g., lens), storage, a system on a chip, a CPU core, a GPU core, memory, Wi-Fi connectivity (e.g., 902.11 b.g), Bluetooth, connectivity (e.g., USB connector), camera, audio, battery (e.g., built-in, rechargeable lithium-ion polymer battery), power connector, computer readable media, software, etc.

Additionally electronic devices and electronic device displays can be configured to include, for example, a button or form factor for user interaction (e.g., power on and off, volume change, etc.). Buttons can be provided and/or integrated in the electronic device housing or be included as part of an electronic device screen. Dimensions of the form factor could be less than or equal to 900 mm$^2$, less than or equal to 400 mm$^2$, less than or equal to 225 mm$^2$, less than or equal to 100 mm$^2$, less than or equal to 75 mm$^2$, less than or equal to 50 mm$^2$, less than or equal to 25 mm$^2$, less than or equal to 10 mm$^2$, or less than or equal to 5 mm$^2$ in a first two dimensional aspect. In some embodiments the thickness of the form factor is less than or equal to 2 mm or more preferably less than or equal to 1.5 mm. Further embodiments can have the form thickness less than or equal to 1 mm.

Biometric sensors can include, for example, a fingerprint sensor, a velocity sensor, and an integrated circuit which is electrically connected to the fingerprint sensor and the velocity sensor. Conductive traces of an image sensor and velocity sensor can be etched or otherwise formed on an upper side of a substrate. A protective coating can be applied to the upper surface of the substrate, over the image sensor and velocity sensor to provide electrical isolation and mechanical protection of the sensors. Alternatively, conductive traces of an image sensor can be formed on a bottom-side of a substrate, wherein the substrate can act as a protective coating and can be further improved with a hard coating applied to the upper surface. Further details about fingerprint sensor configurations are contained in, for example, U.S. Pat. No. 7,751,601 to Benkley III for "*Fingerprint Sensing Assemblies and Methods of Making*"; U.S. Pat. No. 7,099,496 to Benkley III for "*Swiped Aperture Capacitive Fingerprint Sensing Systems and Methods;*" U.S. Pat. No. 7,463,756 to Benkley III for "Finger Position Sensing Methods and Apparatus;" U.S. Pat. No. 7,460,697 to Erhart et al. for "Electronic Fingerprint Sensor with Differential Noise Cancellation;" U.S. Pat. No. 7,146,024 to Benkley III for "Swiped Aperture Capacitive Fingerprint Sensing Systems and Methods;" U.S. Pat. No. 6,400,836 to Senior for "Combined Fingerprint Acquisition and Control Device; " and U.S. Pat. No. 6,941,001 to Bolle for "Combined Fingerprint Acquisition and Control Device."

In the fingerprint sensor packagings disclosed herein, a biometric sensor, such as a fingerprint sensor, is integrated or integratable with an electronic device display or electronic device housing and is positionable on or adjacent an uppermost surface of the electronic device display or housing such that the fingerprint sensor is within about 250 microns of a finger when the finger comes in contact with the uppermost surface of the electronic device. In at least some configurations, the fingerprint sensor packagings can be configured such that the finger sensor is configured to be positioned within about 200 microns of a finger, more preferably within 150 microns, still more preferably within 100 microns, or even more preferably within 50 microns of a finger, when the finger comes in contact with the uppermost surface of the electronic device. In at least some configurations, the fingerprint sensor packagings can be configured such that the finger sensor is configured to be positioned more than 50 microns away from a finger, more than 100 microns away from the finger, more than 150 microns, and in some configurations more than 200 microns from a finger surface when the finger comes in contact with the uppermost surface of the system. Other fingerprint sensor packagings are disclose in US2011/0298711 A1 published Dec. 8, 2011, entitled *Integrated Fingerprint Sensor and Navigation Device*, by Dean et al.

In some configurations, a single chip can be provided that controls one or more of the display, touch screen and the fingerprint sensing functions. Additionally, the sensor can be incorporated in such a way that the surface of the electronic device incorporating the fingerprint sensor packagings presented to a user is smooth or substantially smooth. Displays and systems can be configured such that they are integrally formed such that they act in a unified manner or such that the completed electronic device is comprised of a single component.

II. Biometric Sensor Devices

FIG. 1 illustrates a user interface 100, such as a fingerprint sensor, positioned within a housing form factor 110 of an electronic device user interface, such as a button, from a top or upper perspective surface 102 view. The user interface housing 110 is configurable to be integrated into an electronic device, such as a smart phone, having an electronic device or display interface which a user engages with their finger. Suitable dimensions for the form factor correspond to the nature of the electronic device input. Suitable two dimensional sizes, for a square or rectangular input device are, for example, 4 mm×1 mm, 4 mm×4 mm, 5 mm×15 mm, 10 mm×10 mm, and 10 mm×15 mm. Suitable diameters, for round or oval input devices are, for example, 4 mm, 5 mm, 6 mm, 7 mm, 8mm, 9mm, and 10mm. Other dimensions could be used without departing from the scope of the disclosure.

Depending upon the nature of the electronic device and display that the user interface housing is integrated into, the user interface can further be comprised of a plurality of parts, as discussed in further detail below.

In this configuration, the user interface housing 110 has a cover layer 120 over a sensor component (not shown) and an ink layer or mask 124 cover the cover layer 120. An interface area 106, such as a swipe or placement area that would be used for a fingerprint sensor, could be at least a portion of the upper surface of the biometric sensor. As will be appreciated by those skilled in the art, the shape of the user interface housing 110 could be any geometric shape desired, including, but not limited to, round, oval, ovoid, elliptical, square, rectangular, trapezoidal, triangular, etc. Additionally, the size of the user interface housing can be adjusted depending on whether the biometric sensor is a one-dimensional (1D) sensor or a two-dimensional (2D) sensor. A flex circuit 138 having a PCB 138 which enables the user interface 100 to connect to a socket is also provided.

The mask 124 is typically positioned such that it obscures electronics located within the housing under a portion of the interface 120. For example, in a touch screen interface, a portion of the interface that is not covered by mask can be configured to have a plurality of touch screen sensors. The plurality of touch screen sensors can be any suitable conductor, including a transparent conductor, for example, from a layer of patterned indium tin oxide (ITO), carbon nanotubes, metal nanowires, conductive polymers or fine metal lines (e.g., copper lines). Additionally, a fingerprint sensor can, but need not, be positioned in a location where the mask is also present. In another configuration, an aperture can be provided in the mask corresponding to all or part of a location where the fingerprint is sensed. The mask or ink layer can be separate from the device into which the sensor is placed or can be formed integral with a mask or ink layer of an electronic device. The sensor can include an interface area 106 where, for example, a user would swipe their fingerprint or place their finger which is then read by the biometric sensor.

Cell phones and tablets devices are using various forms of very high gloss substrates as the cover for their products. These substrates are often materials such as glass, gorilla glass, clear plastic, acrylic, or any other high gloss surfaces. In order to fit into these housings, the finger print sensor must also have a very high gloss surface to match the surrounding surfaces of these products. This patent covers methods for producing such a housing for finger print sensor products. The first step of the process is to determine the user interface, such as a button, top surface material. The material can be glass, plastic, acrylic, or any other clear protective surface. The top surface material is coated on the underside with any form of coloring agent including ink, top coat material, colored epoxy, etc. Adhesive is placed on the coloring agent. A bezel of some form (molded plastic, formed metal, etc.) can be used to form the outer shape of the user interface. The bezel is attached to the adhesive which resides on the coloring agent on the top surface material. The finger print sensor is then attached to the adhesive on the coloring agent of the top surface material, inside the cavity of the bezel. The cavity is then filled with any form of fill material to complete the user interface. Electrical connection is made via a flex connector. This method allows the user interface to take on any shape required by the customer, as the top material and housing maybe shaped to order.

In at least some configurations, the packaged finger print sensor would achieve an aesthetic look and feel which would align with the housing into which it is being placed (typically glass, gorilla glass or acrylic). It would offer higher durability for scratch resistance since the coloring agent is placed on the bottom side of the top material and is not touched by the finger or the external environment. Because the outer body is formed by a molded plastic, the user interface may take on different shapes such as round, pill, or various other button shapes.

FIG. 2*a* is a perspective bottom view of the user interface 200 and user interface housing 210 of FIG. 1. The housing 210 has a base 215 and sensor traces 234. An integrated circuit (IC) 250 is provided in an aperture or recess 218. The IC is in communication with the flex circuit 238 and printed circuit board (PCB) 252. FIG. 2b is a cross-sectional view of the housing 210 and sensor. From the side view, the integrated circuit 250 is apparent. Other configurations can be used, however, without departing from the scope of the disclosure. An aperture 218 can be provided in the housing to facilitate placement of the IC and/or the sensor traces near the upper surface of the housing 220. Additionally, the housing base 215 and housing side walls 216, 216' provide an enclosure for the integrated circuit 250. The side walls 216, 216' provide, at an upper end, a surface upon which a top layer or coating 220 can be placed.

The user interface, such as a button, can also be formed by a bezel and top material. The biometric sensor can then be placed inside of the housing for protection. A potting agent can also be provided inside the housing to protect the sensor located therein. The cavity of the bezel can also be filled to form a surface upon which the user interface will strike. The sensor may utilize a ribbon cable for electrical connection.

As depicted herein a biometric sensor is, but need not be, positioned underneath a mask. The biometric sensor may also operate in tandem with a touch sensor. As will be appreciated by those skilled in the art, a single integrated circuit can be configured to control both the touch sensor circuit and the biometric sensor circuit without departing from the scope of the disclosure. This dual controller could be integrated within the biometric sensor or connected to the biometric sensor through a flexible connector 238. A protective layer 220, such as a protective glass or acrylic layer, can also be positioned over the biometric sensor and an electronic device display.

Figure 3:
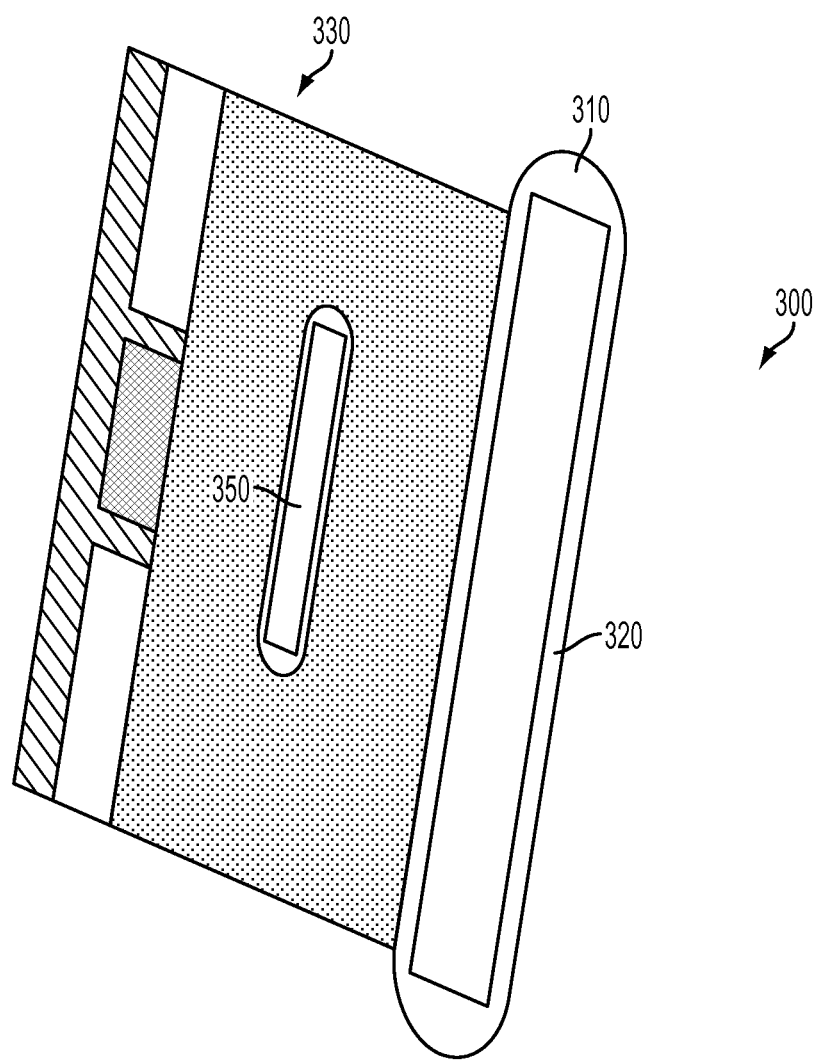
FIG. 3 is an illustration of a electronic device user interface having a fingerprint sensor incorporated therein.

FIG. 3 is an illustration that shows a flattened view of a user interface 300, such as a button, having a biometric sensor 330 incorporated therein. The user interface 300 has a pill-shape profile as illustrated, but could be square or circular as required from the implementation. The biometric sensor 330, either 1D or 2D, is positioned within a portion of the user interface housing 310 and positioned to be attached to the top layer 320. A flexible substrate extends from the embeddable biometric sensor 330 such that the substrate can be wrapped around, for example, a plate, or otherwise configured to fit within the housing 310. The integrated circuit 350 which controls the operation of the biometric sensor is on an opposing end of the flexible substrate and in electrical communication with the sensor.

The housing and sensor configuration shown in FIGS. 1-3 are adaptable to be integrated within an electronic device, such as those described above.

Figure 4A:
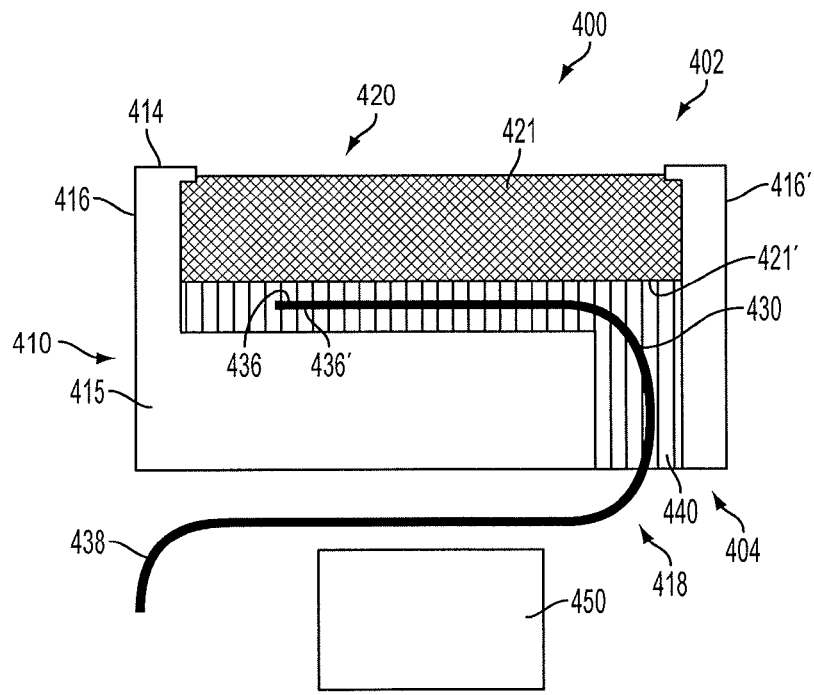
FIGS. 4A-C are cross-sectional views of an embodiment of an electronic device user interface having a fingerprint sensor incorporated therein.

FIG. 4A is a cross-sectional view of an embodiment of a user interface 400, such as a button, having a one dimensional (1D) or two dimensional (2D) biometric sensor 430, such as a chip on flex (COF) fingerprint sensor, incorporated therein. The user interface 400 has an upper surface 402 and a lower surface 404 and is configurable to provide, for example, a glass or suitable hard coat or film top layer 420 having an upper surface 421 and a lower surface 421', which is surrounded by a housing 410 on two or more sides. In this configuration, the edges of the top layer 420 are enclosed by a bezel 414, such as a rim that retains the top layer 420 within the housing 410. The upper surface 421, of the top layer 420 is an interface for a finger during use of a device that incorporates a biometric sensor and capture of biometric information from a finger of a user. The top layer 420 can be configured to provide protection for the biometric sensor 430. The top layer 420 can be composed of different materials and/or colors which may also provide decorative identification. Additionally, the top layer can be formed from a hard material providing mechanical protection to the sensor. The bottom portion of the housing 412 can also provide mechanical support for the user interface assembly.

The housing 410 is formable from, for example, polycarbonate (PC), acrylonitrile-butadiene-styrene (ABS) or other suitable material, including any thermoplastic characterized by high-impact strength, as well as metals such as aluminum and titanium. The housing 410 is configurable to have a base 415, and parallel side walls 416, 416' (in a two dimensional cross-section), an aperture 418 can be provided through which flexible circuit 438 of the sensor 430 passes to connect to the integrated circuit 450 which is positionable away from the housing 410.

The top layer 420 can be formed from glass or any other suitable material such as shatter resistant substitutes for glass, including polymethylmethacrylate (PMMA), polyethylene terephthalate (PET), etc. The biometric sensor 430 can be formed from, for example, from a flexible circuit formed from flex circuit on top of a flexible film substrate with metal traces that are in communication with an integrated circuit chip 450. An integrated circuit chip 450 need not form part of the stack of materials and thus, in that configuration, provides no mechanical functionality to the sensor/finger interface or mechanical operation of the user interface or button. An adhesive or potting material 440, such as thermo-setting plastic or silicone rubber gel, is provided that secures and/or stabilizes the positioning of the sensor 430 in a position between a bottom portion of the housing 410 and the top layer 420 which is engaged by the user during use. The adhesive or potting material 440 can consist of different regions or layers depending on the assembly method. Additionally, the adhesive or potting material 440 may also consist of multiple adhesives or potting materials depending on assembly method and required properties of the user interface. As discussed above, dimensions of the form factor could be less than or equal to 900 mm$^2$, less than or equal to 400 mm$^2$, less than or equal to 225 mm$^2$, less than or equal to 100 mm$^2$, less than or equal to 50 mm$^2$ in a first two dimensional aspect. In some embodiments the thickness of the form factor is less than or equal to 2 mm or more preferably less than or equal to 1.5 mm. Further embodiments can have the form thickness less than or equal to 1 mm.

The potting material 440 can be selected such that it provides mechanical support for the sensor 430. Impact resistance of the user interface 400 is enhanced by maintaining a high hardness (modulus) throughout and/or thin adhesive thickness. Further the silicon integrated circuit (IC) chip is not included in this potting area to avoid thermal expansion, humidity expansion and general durability issues that might arise.

As will be appreciated by those skilled in the art, biometric sensors can include, for example, a fingerprint sensor, a velocity sensor, and an integrated circuit which is electrically connected to the fingerprint sensor and the velocity sensor. Biometric sensors can further include sensors adapted and configured to capture one or more parameters of, for example, a fingerprint. Conductive traces (not shown in FIG. 4A) of an image sensor and velocity sensor can be etched or otherwise formed on an upper side of a substrate. Moreover, the traces can be positioned on the flexible substrate 438 such that the traces are up (and thus on an upper surface 436 of the substrate proximal to the top layer 420), or the traces are down (and thus on a lower surface 436' of the substrate distal the top layer). In some configurations, the flex 438 can be configurable to have functionality on both the upper surface 436 and the lower surface 436' which enables the width of the flex 438 to be reduced, and also reduces the overall package size.

Moreover the user interface 400 can be part of a mechanically functional switch or a mechanically fixed button. Additionally, the user interface 400 can be used for biometric sensing (fingerprint sensing), navigation, or touch sensing.

As will be appreciated in reviewing FIG. 4A, the IC chip 450 need not be positioned within the stack of materials. Where the IC chip 450 is positioned away from the stack of materials forming the button, the user interface 400 can achieve a more compact profile and lower height which makes the user interface 400 more adaptable to be incorporated into an electronic device, such as a smart phone or touch pad. Additionally, the configuration enables the properties (e.g., cover, adhesive material, housing) to be tuned for functionality and durability.

In configurations where the conductive traces are positioned on the top side of the flex 438, a protective coating can be applied to the upper surface of the flex 438 itself, over the image sensor and velocity sensor to provide electrical isolation and mechanical protection of the sensors. Alternatively, conductive traces of an image sensor can be formed on a bottom-side of a substrate 438, wherein the substrate 438 acts as a protective coating and can be further improved with a hard coating applied to the upper surface of the flex 438 itself.

The user interface 400 can be configurable such that it has a transparent interface, an opaque top coat, or a mask layer, is formed such that the upper surface material is not visually transparent. Additionally, the upper surface can be configurable such that it provides a variety of tactile interfaces, e.g., rough or smooth. An "anti-fingerprint and/or anti-smudge" ("AF") coating can be applied and/or a hard coating.

Figure 4B:
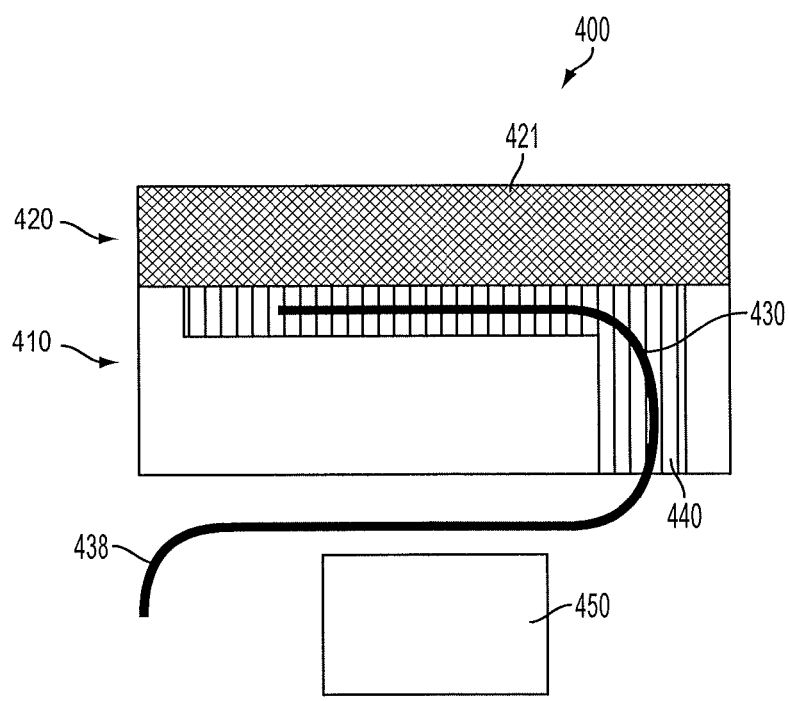

FIG. 4B is a cross-sectional view of another configuration of a user interface 400 having a 1D or 2D biometric sensor, such as a COF fingerprint sensor, incorporated therein. In this embodiment the top layer 420, formed from glass or any other suitable material such as shatter resistant substitutes for glass, including polymethylmethacrylate (PMMA), polyethylene terephthalate (PET), extends at least partly on top of some or all of the sides of the housing 410.

Figure 4C:
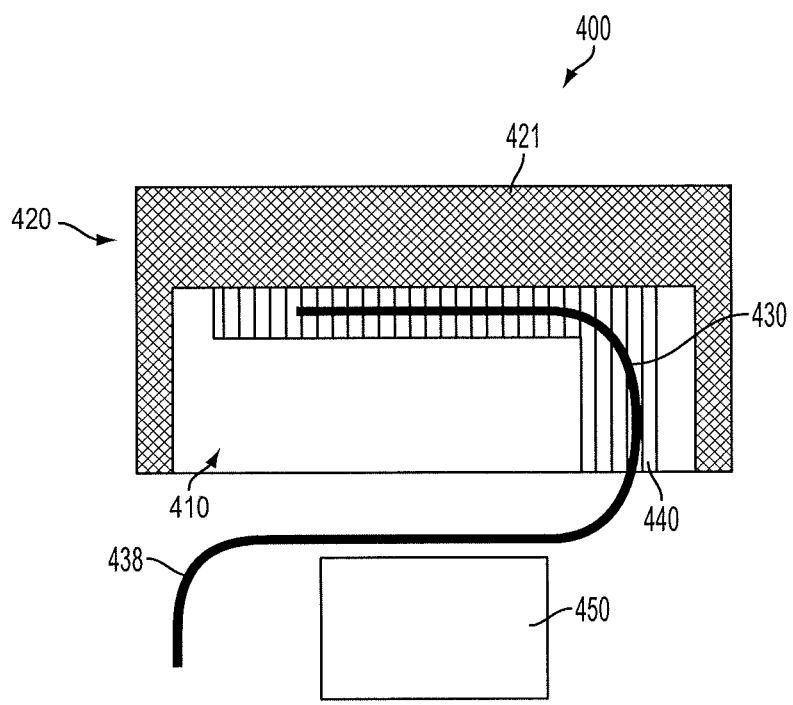

FIG. 4C is a cross-sectional view of another configuration of a user interface 400 having a 1D or 2D biometric sensor, such as a COF fingerprint sensor, incorporated therein. In this embodiment the top layer 420 is over-molded which extends the top layer 420 over and at least partly surrounds at least one side the housing 410. This top layer 420 may be firmed by over-molding, wet coating or any suitable method.

Figure 5A:
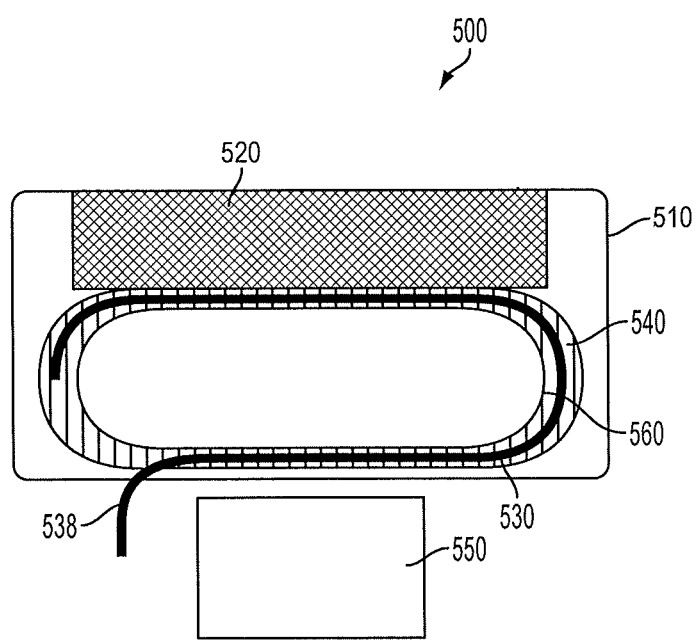
FIGS. 5A-C are cross-sectional views of another embodiment of an electronic device user interface having a fingerprint sensor incorporated therein.

FIG. 5A is a cross-sectional view of another configuration of a user interface 500 having a biometric sensor 530 incorporated therein. The user interface 500 is configurable to provide, for example, a glass or suitable hard coat or film top layer 520 which is surrounded by a user interface housing 510. The user interface housing 510 can be formed from polycarbonate (PC) or other suitable material including but not limited to metals such as aluminum. The biometric sensor 530 includes, for example, a flexible circuit 538 which is in communication with an integrated circuit 550. This configuration is illustrated with the adhesive or potting material, 540 which may or may not be utilized depending on the method of manufacture. The flexible circuit 538 is secured and/or stabilized about a plate or support 560 that can be fitted within a lower surface of the housing 510 and, for example, clipped into place. In this configuration the flexible circuit 538 wraps around the plate 560 and then the flex/plate combination is then clipped into the housing 510. In another example the plate 560 is clipped into the housing 510 and then the flex 538 wraps around the plate 560. Additionally, the plate 560 may be placed into position within the housing 510 using an adhesive instead of being clipped into place. Adhesive and/or potting materials may also be optionally used. In some configurations, the glass, hard coat or hard film can be bonded directly to the sensor or can be bonded with an adhesive.

Figure 5B:
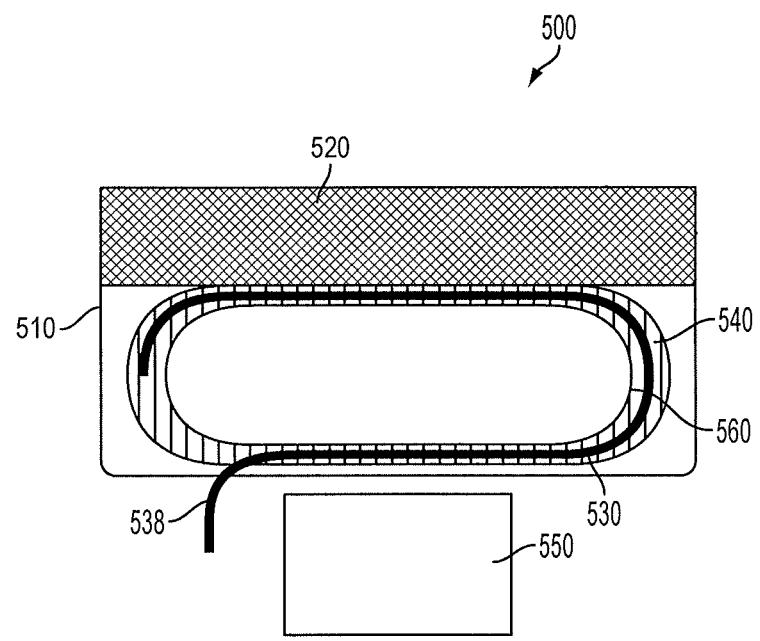

FIG. 5B is a cross-sectional view of another embodiment of a user interface 500 having a fingerprint sensor 530 incorporated therein. The user interface 500 is configurable to provide, for example, a top layer 520 that extends at least partly on top of some or all of the sides of the housing 510.

Figure 5C:
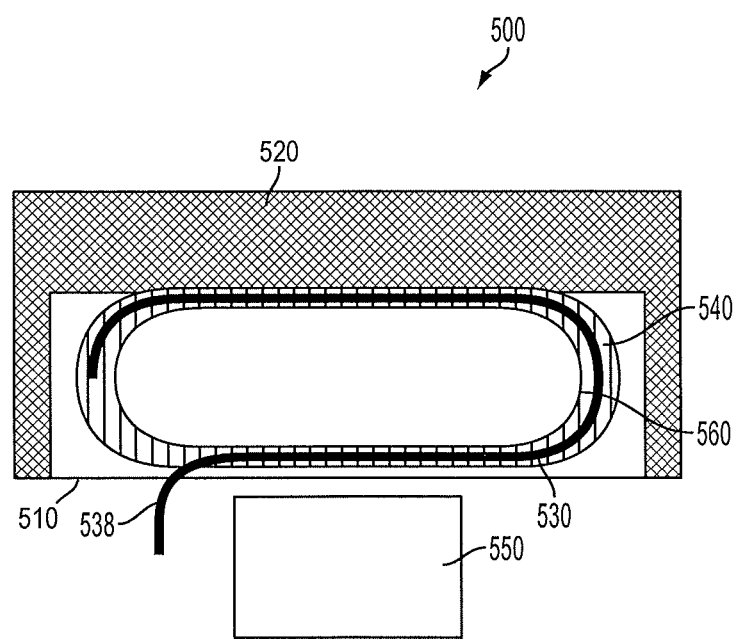

FIG. 5C is a cross-sectional view of another embodiment of a user interface 500 having a fingerprint sensor incorporated therein. The user interface 500 is configurable to provide, for example, a top layer 520 that extends over and at least partly surrounds at least one side of the housing 510. This top layer 520 may be formed by over-molding, wet coating or any suitable method.

Figure 6:
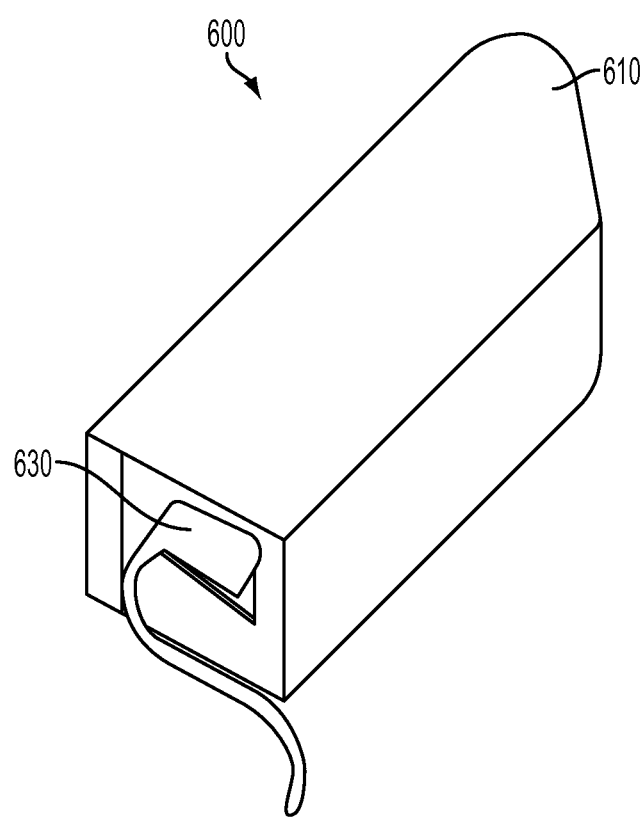
FIG. 6 is a perspective view of an electronic device user interface housing with a fingerprint sensor positioned therein.

FIG. 6 is a perspective view of a user interface 600 having a user interface housing 610 with a fingerprint sensor 630 therein.

Figure 7:
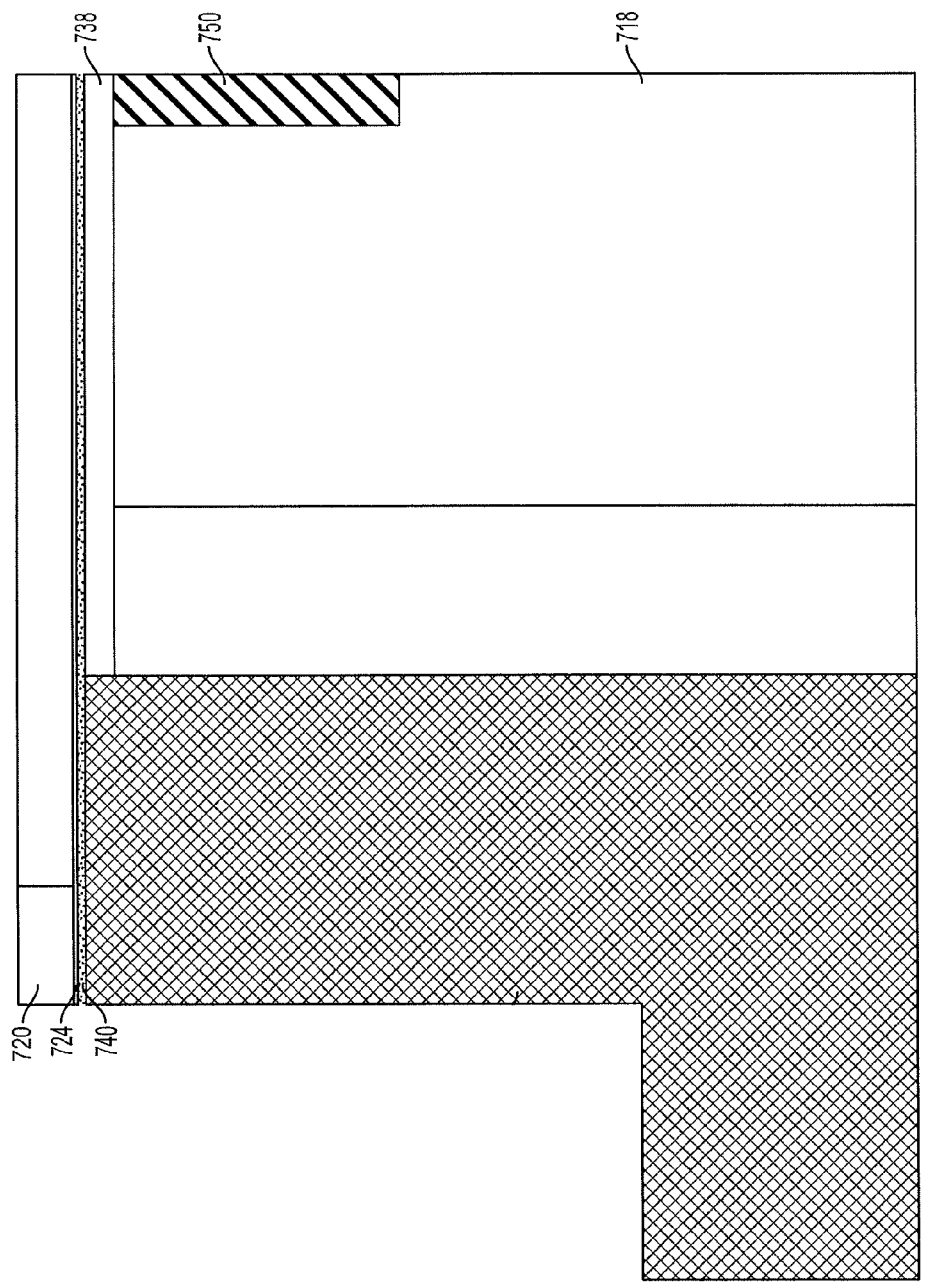
FIG. 7 is a stack-up of an electronic device user interface according to the disclosure.

FIG. 7 illustrates a stack up cross-section of a button as described above. The stack-up has a top layer 720 of 0.05 mm thickness, an ink or mask layer 724 of 0.01 mm thickness, an adhesive layer 740 of 0.01 mm thickness, and a layer of the flex 738 of 0.06 mm thickness. As will be appreciated by those skilled in the art, the thicknesses are provided by way of illustration only and other thicknesses for each component could be used without departing from the scope of the disclosure. Additionally, a cavity for fill 718 is provided and a silicon area 750 is provided.

In another configuration, the sensor is constructed using a single layer of Kapton® as a substrate, or dual layers of Kapton®. Dual layer substrates can be connected together with, for example, ACF material. FR-4 substrates, which are a composite material composed of woven fiberglass cloth with an epoxy resin binder that is flame resistant, are connected to one or more of the flexible substrates. The fingerprint sensor contact surface may be different materials to service various commercial implementations including, for example, glass, top coat, ink, polyimide/Kapton, such as described in U.S. Provisional 61/619,254 filed Apr. 2, 2012.

The fingerprint sensors are configurable to achieve a desired aesthetic look and feel which could also align with the housing into which the sensor is being placed.

The fingerprint sensor packagings, with sensor circuitry, can be located either in the IC or in the package. The fingerprint sensor makes electronic contact through the package surface (e.g., bumps on the front side which contact the surface metal traces, or through back side contacts which connect to a separate interface (e.g., PCB, cable, FFC, etc.) In another configuration, the IC is attached to the metal (ITO, Cu) of the glass. Sensing circuitry can be located in the IC. The IC can be powered and communicated to the vias by the metal traces routed on the glass. In both instances, the finger is sensed through the glass. In both cases, the fingerprint sensor can be attached to the metal of the glass which is already being used for the touch screen function. The fingerprint sensor can also be attached to the glass and the power and I/O come through an external cable connection. Thus silicon or packaged fingerprint sensors can be configured to achieve an aesthetic look and feel which aligns with the glass topped electronic devices (e.g., phones, tablets, LCD screens). The sensor is positionable behind the glass and imaging is done through the glass. Metal of the glass, which is used to create the touchscreen, can also be used for communication and to power the fingerprint sensor.

Figure 8A:
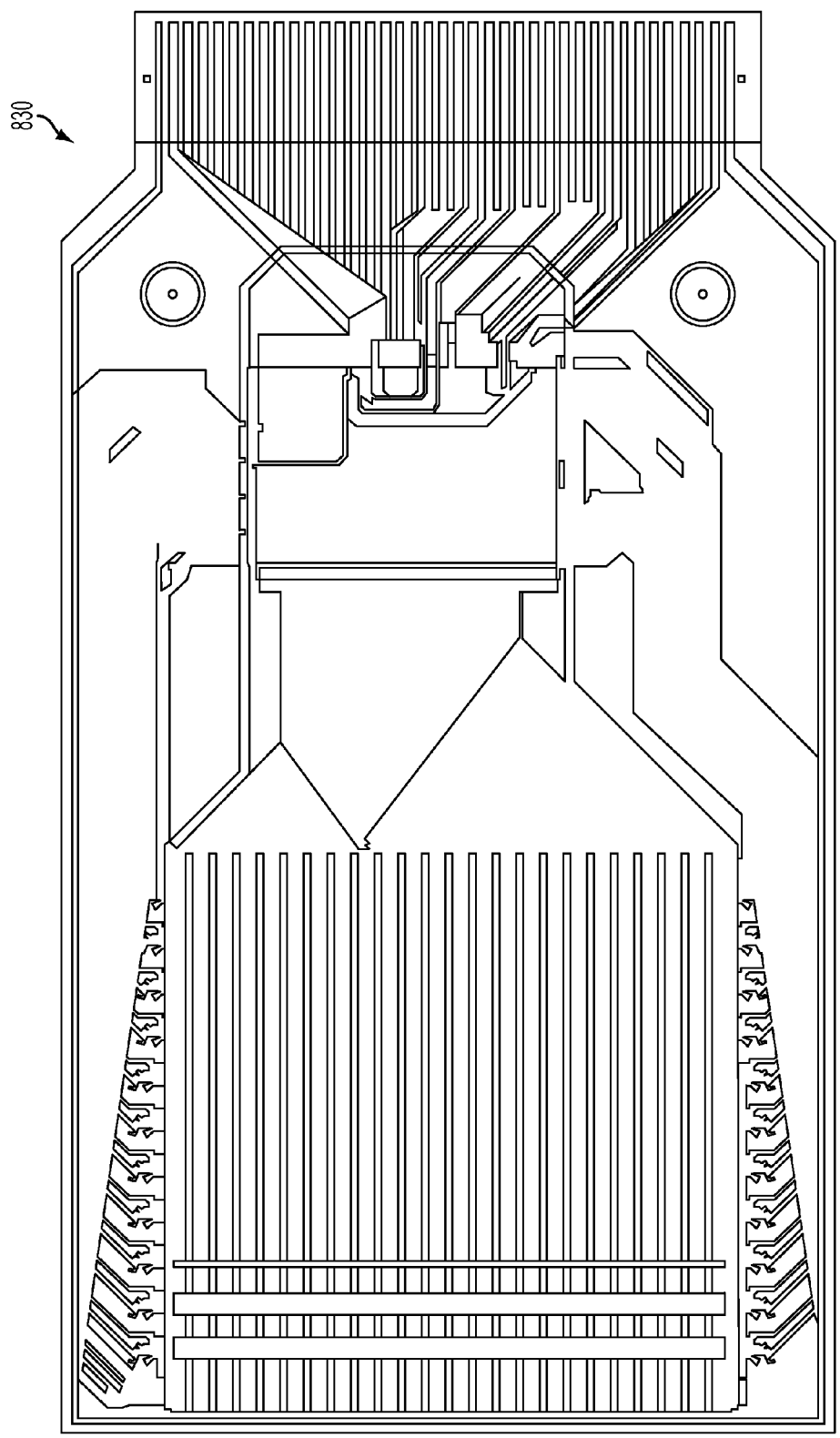
FIGS. 8A-B illustrates fingerprint sensors suitable for use with the electronic device user interface disclosed herein.
Figure 8B:
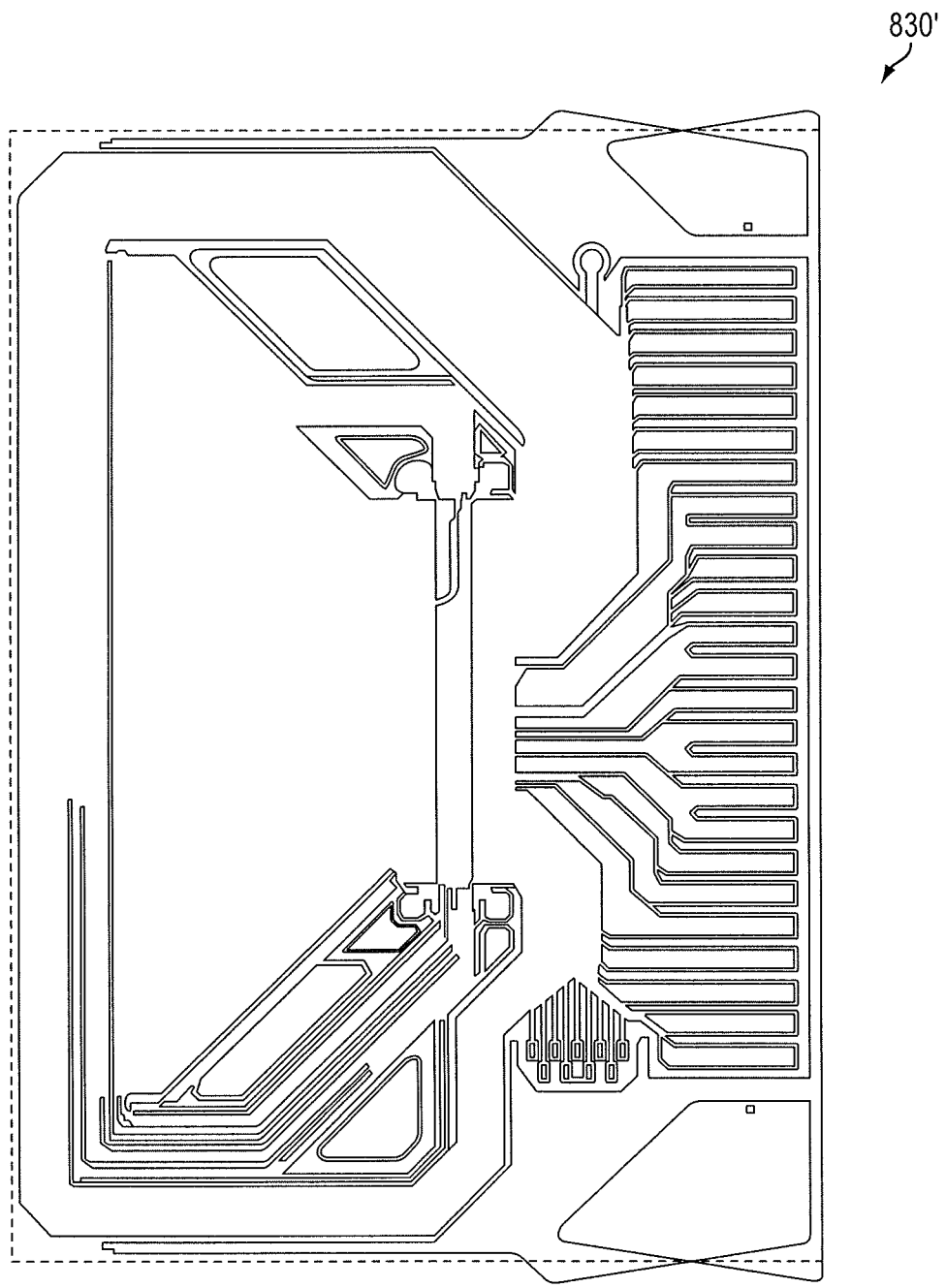

FIGS. 8A-B illustrates fingerprint sensors 830 suitable for use with the user interfaces disclosed herein. Suitable 1D sensors possess from 90 to 300 pixels, or more preferably from 114 to 200 pixels. Suitable 2D sensors possess arrays of pixels in the range of 90 to 300 pixels by 90 to 300 pixels, or more preferentially a range of 114 to 200 pixels by 114 to 200 pixels. A size is from 8 to 30 mm across the broadest length, or more preferably from 6 to 20 mm. FIG. 8A illustrates an example of a 2D touch sensor 830 layout on flex; FIG. 8B illustrates an example of a 1D sensor 830' layout on flex.

III. Methods of Use

The user interfaces may be housed in a host electronic device and configured to perform both object image capture and at least one of an activation of the host device, an activation of a host device function and an input to the host device. The user interfaces may further comprise a button interface configured to allow a user to contact the switch simultaneously with providing object image data through an intersection of the at least one drive line and the at least one pickup line. The object may a finger and the user interfaces, such as a button, configured to sense a fingerprint image. The user interfaces described above can also be used to create, for example, a functional button (e.g., on/off), to provide navigation functionality, and/or to provide biometric sensing (such as fingerprint sensing).

IV. Methods of Manufacture

In one manufacturing example, the user interface is manufactured according to the following:
  Singulate flex by, for example, laser cutting adjoining laminated material.
  ACF attach connection to flex may occur prior to singulating flex, after singulating flex or after final user interface assembly.
  Form housing, for example, using a cast or machine.
  Provide flex sensor with the ACF board.
  Flex bonded to housing.
  Assemble housing if needed.
  Form top layer either on the flex area only or on the housing only or both the flex and housing. The top layer could be a curable wet coat or cast or hard film bonded with adhesive among other materials.
  ACF attach connection to flex if not connected previously.

In another manufacturing example, the user interface is manufactured according to the following:
  Singulate flex.
  ACF attach connection to flex may occur prior to singulating flex, after singulating flex or after final user interface assembly.
  Form top layer on the flex area. The top layer could be a curable wet coat or cast or hard film bonded with adhesive among other materials. Applying top layer may occur prior to singulating flex.
  Flex bonded to housing.
  Housing assembled if needed.
  ACF attach connection to flex if not connected previously.

In still another manufacturing example, the user interface is manufactured according to the following:
  Singulate flex.
  ACF attach connection to flex may occur prior to singulating flex, after singulating flex or after final user interface assembly.
  Top layer bonded to housing. The top layer could be a curable wet coat or cast or hard film bonded with adhesive among other materials.
  Bond flex to top layer and/or housing.
  Form support behind flex either by filling using an epoxy and/or bond plate in place.
  ACF attach connection to flex if not connected previously.

In a fourth manufacturing example, the user interface is manufactured according to the following:
  Singulate flex.
  ACF attach connection to flex may occur prior to singulating flex, after singulating flex or after final user interface assembly.
  Attach flex to the bottom plate of the housing.
  Attach plate/flex combination to the housing.
  Attach top layer to the housing.
  Use adhesive or potting material if needed to fill volume.
  ACF attach connection to flex if not connected previously.

Figures 9A, 9B:
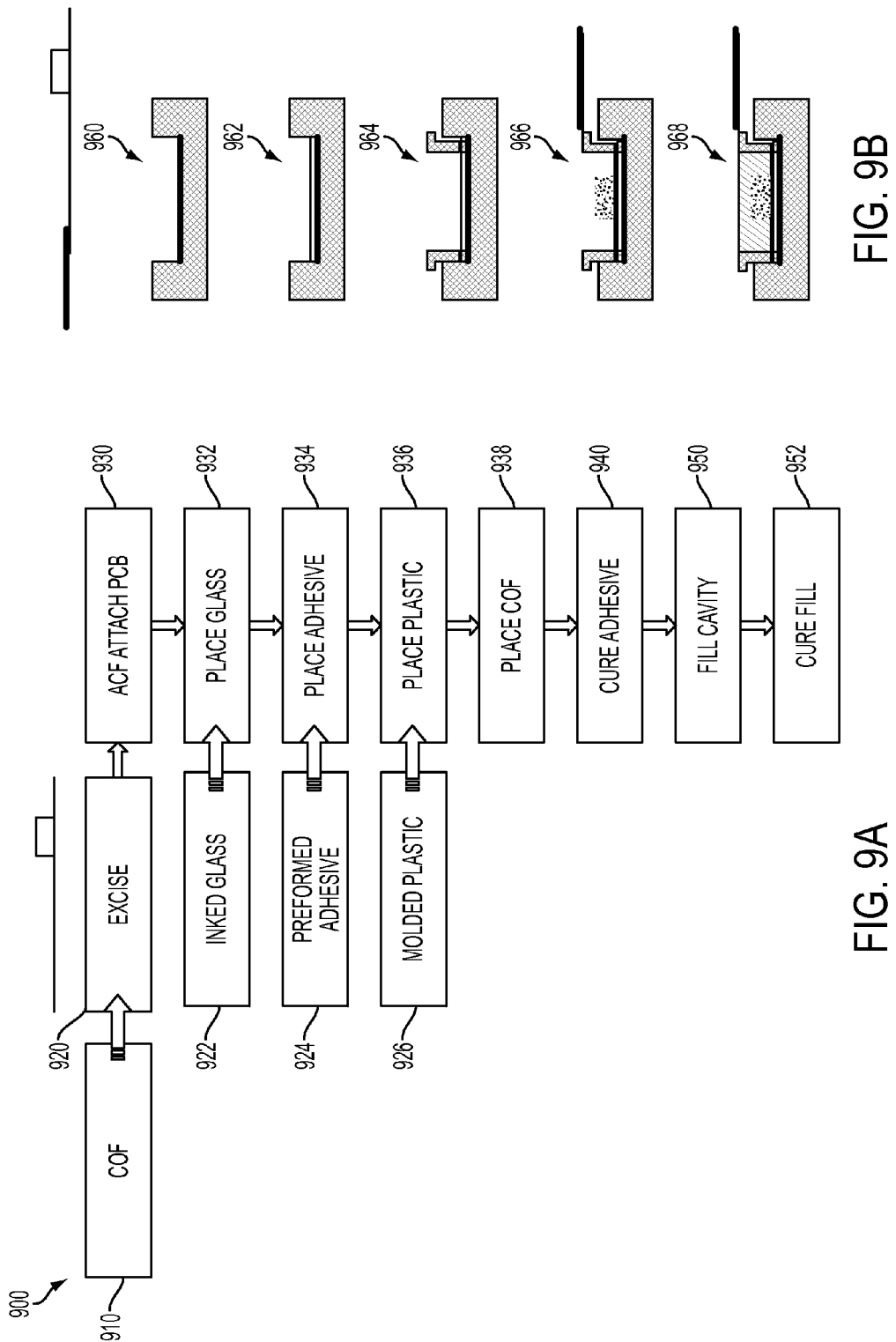
FIGS. 9A-B illustrate processes for manufacturing a sensor device according to the disclosure.

FIG. 9A illustrates a manufacturing process 900 for the sensor devices described above. A chip on flex (COF) 910 is excised 920. After which an anisotropic conductive film tape (ACF) is attached to a PCB 930. Ink 922 is placed on glass 932. The ACF/PCB substrate is placed on the glass 932 with the ink, which is then stacked on adhesive 934, which can use a preformed adhesive 924, and then placed on a plastic layer 936, which can use a molded plastic 926. A chip-on-flex (COF) 938 is then added. Thereafter the adhesive is cured 940, the cavity is filled 950, and the fill is cured 952. As show in FIG. 9B a coated to surface is place in an assembly mold 960. Thereafter an adhesive coloring agent can be provided 962. Additionally, a bezel can be placed into the adhesive 964. The fingerprint sensor is then placed onto an adhesive inside of the bezel 966. The bezel cavity is then filled 968.

The manufacturing processes are configurable to simplify the user interface manufacturing process using advanced manufacturing techniques while optimizing image capture through the molding compounds and/or layers.

Fingerprint sensor senses fingerprint characteristics of a finger, for example, when a finger is swiped along the surface of protective layer proximate the fingerprint sensor. The protective layer and display layer can be formed from any suitable non-conductive material (e.g., glass, PET or a suitable hard coating). Fingerprint sensor is adapted and configured such that it is capable of sensing ridges and valleys of a user's finger at or within a target distance from the device surface. The target distance is less than 250 microns, more preferably within 200 microns, even more preferably within 150 microns, still more particularly is less than 100 microns, and even more particularly is less than 50 microns. In at least some configurations, the target distance can be more than 50 microns, more than 100 microns, more than 150 microns, and more than 200 microns.

The flex section is adapted and configured to electrically engage the conductor and a suitable integrated circuit (IC), application-specific integrated circuit (ASIC) or chip.

As will be appreciated by those skilled in the art, wrap-around leads in a direct build-up approach of a fingerprint sensor can be used. A protective layer such as hard coating is positionable over a mask. A planarization layer can also be provided which is positioned over a patterned conductive layer. The cover lens can be configured such that it has a conductive lead wrapped around an end which engages a flex having a chip via an ACF.

In other configurations, a wrap-around lead can be used in an ultrathin glass approach of a fingerprint sensor. A protective layer such as ultrathin glass is provided which covers a mask. A patterned conductive layer is positioned over an optional optical coat. A cover lens of a display is provided which has a wraparound lead printed thereof. The lens can be adhered to the optical coat (if present), the patterned conductive layer, the mask and the ultrathin glass via an adhesive. A flex having a chip can be connected to the wrap around leads of the cover glass or lens via an ACF.

In still other configurations, thin glass and a transparent flex can be used. A thin glass layer is provided as a first layer. A mask may be applied to a lower surface of the thin glass layer. A clear adhesive is then positioned between the thin glass layer and a transparent plastic layer. At some positions the clear adhesive will come into contact with and one or more of a transparent sensor, flexible traces, and the transparent plastic layer. The transparent plastic layer can be configured such that it wraps around the end of the cover lens (as illustrated), or so that it extends to the peripheral two-dimensional geometry of the cover lens. A transparent adhesive can also be provided above the cover lens and below the transparent plastic. The sensor, such as would be formed from a transparent conductor, is connected to, incorporated with, or in communication with flexible metal traces that wrap around the end of the cover lens where a flex having a chip can be connected to the wrap around leads of the cover glass or lens via an anisotropic conductive film (ACF) are positioned. The flex can be transparent. Moreover, transparent conductors can combine with the flex. As with the prior configurations, the entire electronic device interface can be positioned within a housing of a suitable electronic device. The fingerprint sensor can be patterned in Cu or another non-transparent conductor and located under the ink mask while the transparent touch sensor can be made using the same layer, if desired, or additional layers. In at least some configurations, the touch sensor and the fingerprint sensor are positioned on the same layer.

In some configurations, for example, copper traces can be used to form the flexible traces and the fingerprint sensor, while transparent conductors can be used to form the transparent sensor.

The device further includes sensor control logic configured to control the basic operations of the sensor element. The exact operations of the sensor element governed by the sensor logic control depends on a particular sensor configuration employed, which may include power control, reset control of the pixels or data contact points, output signal control, cooling control in the case of some optical sensors, and other basic controls of a sensor element. Sensor controls are well known by those skilled in the art, and, again, depend on the particular operation.

Sensing device further is adaptable to include a readout circuit for reading analog output signals from sensor element when it is subject to a fingerprint juxtaposed on a sensor surface. Readout circuit can further include an amplifier configured to amplify the analog signal so that it can more accurately be read in subsequent operations. A low pass filter is configured to filter out any noise from the analog signal so that the analog signal can be more efficiently processed. Readout circuit further includes an analog-to-digital (A/D) converter that is configured to convert the output signal from sensor element to a digital signal that indicates a series of logic 0's and 1's that define the sensing of the fingerprint features by the pixels or data contact points of sensor surface. Such signals may be separately received by the motion sensors and the fingerprint sensing surfaces, and may be read out and processed separately.

Readout circuit may store the output signal in a storage, where fingerprint data is stored and preserved, either temporarily until a processor can process the signal, or for later use by the processor. Processor includes an arithmetic unit configured to process algorithms used for navigation of a cursor, and for reconstruction of fingerprints. Processing logic is configured to process information and includes analog to digital converters, amplifiers, signal filters, logic gates (all not shown) and other logic utilized by a processor. A persistent memory is used to store algorithms and software applications that are used by processor for the various functions described above, and in more detail below. A system bus is a data bus configured to enable communication among the various components contained in sensing device. As will be appreciated by those skilled in the art, memory and storage can be any suitable computer readable media.

The system further includes a controller communicating with the fingerprint sensor lines to capture a fingerprint image when a user's fingerprint is swiped about the fingerprint sensor lines. In one system, there may be separate controllers for both the display and the fingerprint sensor, where the system is configured to include a display controller configured to control the visible display separate from the fingerprint sensor operations. Alternatively, a single controller may be used to control, for example, the visible display and the fingerprint sensor operations. The fingerprint sensor could also be patterned onto the top glass of the display itself, and not onto a touch-screen layer.

Sensors and form factors as described can be used within a communication network. As will be appreciated by those skilled in the art, the present disclosure may also involve a number of functions to be performed by a computer processor, such as a microprocessor, and within a communications network. The microprocessor may be a specialized or dedicated microprocessor that is configured to perform particular tasks according to the disclosure, by executing machine-readable software code that defines the particular tasks embodied by the disclosure. The microprocessor may also be configured to operate and communicate with other devices such as direct memory access modules, memory storage devices, Internet related hardware, and other devices that relate to the transmission of data in accordance with the disclosure. The software code may be configured using software formats such as Java, C++, XML (Extensible Mark-up Language) and other languages that may be used to define functions that relate to operations of devices required to carry out the functional operations related to the disclosure. The code may be written in different forms and styles, many of which are known to those skilled in the art. Different code formats, code configurations, styles and forms of software programs and other means of configuring code to define the operations of a microprocessor in accordance with the disclosure will not depart from the spirit and scope of the disclosure.

Within the different types of devices, such as laptop or desktop computers, hand held devices with processors or processing logic, and also possibly computer servers or other devices that utilize the disclosure, there exist different types of memory devices for storing and retrieving information while performing functions according to the disclosure. Cache memory devices are often included in such computers for use by the central processing unit as a convenient storage location for information that is frequently stored and retrieved. Similarly, a persistent memory is also frequently used with such computers for maintaining information that is frequently retrieved by the central processing unit, but that is not often altered within the persistent memory, unlike the cache memory. Main memory is also usually included for storing and retrieving larger amounts of information such as data and software applications configured to perform functions according to the disclosure when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. During data storage and retrieval operations, these memory devices are transformed to have different states, such as different electrical charges, different magnetic polarity, and the like. Thus, systems and methods configured according to the disclosure as described herein enable the physical transformation of these memory devices. Accordingly, the disclosure as described herein is directed to novel and useful systems and methods that, in one or more embodiments, are able to transform the memory device into a different state. The disclosure is not limited to any particular type of memory device, or any commonly used protocol for storing and retrieving information to and from these memory devices, respectively.

A single medium or multiple media (e.g., a centralized or distributed database, and/or associated caches and servers) that store one or more sets of instructions can be used. Any medium, such as computer readable media, that is capable of storing, encoding or carrying a set of instructions for execution by a machine and that causes the machine to perform any one or more of the methodologies of the disclosure is suitable for use herein. The machine-readable medium, or computer readable media, also includes any mechanism that provides (i.e., stores and/or transmits) information in a form readable by a machine (e.g., a computer, PDA, cellular telephone, etc.). For example, a machine-readable medium includes memory (such as described above); magnetic disk storage media; optical storage media; flash memory devices; biological electrical, mechanical systems; electrical, optical, acoustical or other form of propagated signals (e.g., carrier waves, infrared signals, digital signals, etc.). The device or machine-readable medium may include a micro-electromechanical system (MEMS), nanotechnology devices, organic, holographic, solid-state memory device and/or a rotating magnetic or optical disk. The device or machine-readable medium may be distributed when partitions of instructions have been separated into different machines, such as across an interconnection of computers or as different virtual machines. Moreover, the computer readable media can be positioned anywhere within the network.

Networked computing environment include, for example a server in communication with client computers via a communications network. The server may be interconnected via a communications network (which may be either of, or a combination of a fixed-wire or wireless LAN, WAN, intranet, extranet, peer-to-peer network, virtual private network, the Internet, or other communications network) with a number of client computing environments such as tablet personal computer, mobile telephone, smart phone, telephone, personal computer, and personal digital assistant. In a network environment in which the communications network is the Internet, for example, server can be dedicated computing environment servers operable to process and communicate data to and from client computing environments via any of a number of known protocols, such as, hypertext transfer protocol (HTTP), file transfer protocol (FTP), simple object access protocol (SOAP), or wireless application protocol (WAP). Other wireless protocols can be used without departing from the scope of the disclosure, including, for example Wireless Markup Language (WML), DoCoMo i-mode (used, for example, in Japan) and XHTML Basic. Additionally, networked computing environment can utilize various data security protocols such as secured socket layer (SSL) or pretty good privacy (PGP). Each client computing environment can be equipped with operating system operable to support one or more computing applications, such as a web browser (not shown), or other graphical user interface (not shown), or a mobile desktop environment (not shown) to gain access to server computing environment.

As will be appreciated by those skilled in the art, any of the devices within the communication network that have a display (e.g., computer, smart phone, and PDA) can be configured to acquire data from a fingerprint sensor, as described above. Additionally information from the fingerprint sensors can then be transmitted to other devices within the network to facilitate authentication of a user within a network environment regardless of whether the receiving device had a display.

The devices disclosed herein can be used as part of a communication network to provide a mechanism for authenticating biometric information. For example, biometric information can be sensed that is associated with a user; the sensed information can then be compared with a biometric template associated with the user; if the biometric information matches the biometric template, credentials associated with the user can be received based on the biometric information. Additionally, credentials can be communicated, for example, to a requesting process. In another process, a biometric device installed in a client device with a web-enabled application can be identified. Thereafter biometric information associated with a user is identified whereupon a biometric template associated with the biometric information of the user is created. The system can be configured to receive user credentials associated with the user and to bind the user credentials with the biometric template. A web browser application can also be provided that is executable on the devices disclosed which includes a biometric extension configured to communication with the sensors disclosed via, for example, a biometric service and one or more web servers. Tokens can also be used to identify a valid user activation as part of the operation of the disclosed devices.

The use of integratable sensors facilitates the use of, for example, a web browser application that is configured on a client device and configured to be executed by a client processor on the device to facilitate conducting a secure transaction, such as a financial transaction, remotely which is authenticated based on information acquired by an integratable sensor such as those disclosed.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:
1. An electronic device user interface comprising:
 a housing having side walls defining an open upper end having an overall dimension sized to fit into an electronic device;
 a biometric sensor capable of sensing a target biometric parameter, wherein the housing includes a removable bottom plate that attaches to the housing to support the biometric sensor, the biometric sensor comprising:
  a sensor interface with a sensing side, wherein the sensor interface is capable of positioning within the open upper end of the housing, and
  a flexible circuit substrate that wraps around the removable bottom plate such that the removable bottom plate is positioned between a first portion of the flexible circuit substrate and a second portion of the flexible circuit substrate within the housing;
 one or more of a button, a switch, a key, and a mechanism for triggering an event or controlling an operational aspect of the electronic device; and an integrated circuit in communication with the biometric sensor that is positionable within the electronic device and is external to the housing.

2. The electronic device user interface of claim 1 further comprising:
a protective coating that extends over one or more side walls of the housing.

3. The electronic device user interface of claim 1 wherein the biometric sensor further comprises at least one conductive trace connecting the biometric sensor to the integrated circuit.

4. The electronic device user interface of claim 3 wherein the at least one conductive trace is positionable on at least one of a side of the flexible circuit substrate facing towards an exterior of the housing and a side of the flexible circuit substrate facing towards an interior of the housing.

5. The electronic device user interface of claim 2 further comprising:
a potting material positionable between a lower surface of the housing and the protective coating.

6. The electronic device user interface of claim 2 further comprising:
a bezel extending from the side walls of the housing above a bottom of the protective coating.

7. The electronic device user interface of claim 1 further comprising:
a protective coating that extends over one or more side walls of the housing; and
an adhesive potting between the removable bottom plate and the protective coating.

8. The electronic device user interface of claim 1 wherein the biometric sensor is capable of capturing a fingerprint from a finger of a user.

9. A method of fabricating an electronic device user interface comprising:
providing a biometric sensor having a sensor interface with a sensing side and one or more conductive traces thereon, wherein the biometric sensor comprises a flexible substrate;
providing one or more of a button, a switch, a key, and a mechanism for triggering an event or controlling an operational aspect of the electronic device, wherein the biometric sensor is positionable within the one or more of the button, the switch, the key, and the mechanism for triggering the event or controlling the operational aspect of the electronic device;
inserting the biometric sensor and the one or more of the button, the switch, the key, and the mechanism for triggering the event or controlling the operational aspect of the electronic device into a housing that includes a removable bottom plate that attaches to the housing to support the biometric sensor, wherein flexible substrate wraps around the removable bottom plate such that the removable bottom plate is positioned between a first portion of the flexible substrate and a second portion of the flexible substrate within the housing; and
providing an integrated circuit within the electronic device that is external to the housing and in communication with the biometric sensor.

10. The method of claim 9 further comprising:
providing a protective coating on the sensing side of the biometric sensor, wherein the protective coating is formed over one or more side walls of the housing.

11. The method of claim 9 further comprising:
forming at least one conductive trace along the flexible substrate connecting the biometric sensor to the integrated circuit.

12. The method of claim 11 further comprising:
forming the at least one conductive trace along the flexible substrate on one of a side of the flexible substrate adjacent a finger of a user and a side of the flexible substrate facing away from the finger.

13. The method of claim 10 further comprising:
providing an adhesive between the removable bottom plate and the protective coating.

14. The method of claim 10 further comprising:
forming a bezel over at least one edge of the protective coating.

15. An electronic device user interface comprising:
a button housing having side walls and an overall dimension sized to fit into an electronic device; and
a stack of materials positioned within the button housing, the stack of materials comprising:
a plate or support,
a biometric sensor secured and/or stabilized about the plate or support, the biometric sensor capable of sensing a target biometric parameter and having a sensor interface with a sensing side, wherein the biometric sensor includes a flexible substrate and conductive traces positioned on the flexible substrate, wherein the flexible substrate wraps around the plate or support such that the plate or support is positioned between a first portion of the flexible substrate and a second portion of the flexible substrate in the stack of materials, and
an upper layer that sits atop the sensing side of the biometric sensor;
wherein the stack of materials does not include an integrated circuit.

16. The electronic device user interface of claim 15, further comprising:
an integrated circuit in communication with the biometric sensor and positioned away from the stack of materials.

17. The electronic device user interface of claim 16, wherein the integrated circuit in communication with the biometric sensor is in communication with the conductive traces and is configured to capture a fingerprint image.

18. The electronic device user interface of claim 17, wherein the upper layer is surrounded by the button housing.

19. The electronic device user interface of claim 17, wherein the upper layer extends at least partly on top of some or all of the side walls of the button housing.

20. The electronic device user interface of claim 17, wherein the upper layer extends over and at least partly surrounds at least one side wall of the button housing.

* * * * *